US012454750B2

(12) United States Patent
Kundu et al.

(10) Patent No.: US 12,454,750 B2
(45) Date of Patent: Oct. 28, 2025

(54) EVAPORATOR FOR EFFECTIVE SURFACE AREA EVAPORATION

(71) Applicant: Elevated Materials US LLC, Santa Clara, CA (US)

(72) Inventors: Sambhu Kundu, Fremont, CA (US); PrasannaKalleshwara Buddappa Ramachandrappa, Santa Clara, CA (US); Vicente M. Lim, Newark, CA (US); Subramanya P. Herle, Mountain View, CA (US); Visweswaren Sivaramakrishnan, Cupertino, CA (US)

(73) Assignee: Elevated Materials US LLC, Santa Clara, CA (US)

( * ) Notice: Subject to any disclaimer, the term of this patent is extended or adjusted under 35 U.S.C. 154(b) by 486 days.

(21) Appl. No.: 17/881,368

(22) Filed: Aug. 4, 2022

(65) Prior Publication Data

US 2023/0048728 A1 Feb. 16, 2023

Related U.S. Application Data

(60) Provisional application No. 63/232,348, filed on Aug. 12, 2021.

(51) Int. Cl.
*C23C 14/24* (2006.01)
*C23C 14/54* (2006.01)
*C23C 14/56* (2006.01)

(52) U.S. Cl.
CPC .......... *C23C 14/243* (2013.01); *C23C 14/541* (2013.01); *C23C 14/568* (2013.01)

(58) Field of Classification Search
CPC ... C23C 14/568; C23C 14/562; C23C 14/243; C23C 14/541; C23C 14/26; H01M 4/0423
See application file for complete search history.

(56) References Cited

U.S. PATENT DOCUMENTS 2,440,135 A 4/1948 Alexander
4,530,100 A 7/1985 Feuerstein et al.
(Continued)

FOREIGN PATENT DOCUMENTS

CN 107815648 A 3/2018
CN 108308994 A 7/2018
(Continued)

OTHER PUBLICATIONS

International Search Report and Written Opinion dated Nov. 21, 2022 for Application No. PCT/US2022/039467.

*Primary Examiner* — Joseph A Miller, Jr.
(74) *Attorney, Agent, or Firm* — Lee & Hayes, P.C.

(57) ABSTRACT

A method and apparatus for thermal evaporation are provided. The thermal evaporator includes a flat crucible design, which provides an increased surface area for evaporation of the material to be deposited relative to conventional designs. The increased surface area for evaporation means that the more vapor of the evaporated material can be produced, which increases pressure inside the evaporator body leading to increased flow of the evaporated material out of the nozzles. The flat crucible can be attached to an evaporator body of the thermal evaporator. The flat crucible can be integrated within the evaporator body. The evaporator body can include a plurality of longitudinal grooves, which increase the surface area of the evaporator body. The thermal evaporator can include a plurality of baffles which divide the thermal evaporator into separate compartments.

19 Claims, 14 Drawing Sheets

(56) References Cited

U.S. PATENT DOCUMENTS

| | | | | |
|---|---|---|---|---|
| 5,223,038 | A | 6/1993 | Kleyer | |
| 5,532,102 | A * | 7/1996 | Soden | G03G 5/08207 430/128 |
| 6,189,806 | B1 | 2/2001 | Klemm et al. | |
| 6,202,591 | B1 | 3/2001 | Witzman et al. | |
| 6,444,043 | B1 * | 9/2002 | Gegenwart | C23C 14/243 392/389 |
| 6,620,372 | B1 | 9/2003 | Ladirat et al. | |
| 7,238,019 | B2 | 7/2007 | Schwenk | |
| 7,339,139 | B2 | 3/2008 | Yang et al. | |
| 7,899,308 | B2 | 3/2011 | Wenk | |
| 8,591,223 | B2 | 11/2013 | Hein et al. | |
| 9,187,821 | B2 | 11/2015 | Priddy et al. | |
| 2005/0039684 | A1 * | 2/2005 | Yi | C23C 14/243 118/726 |
| 2005/0061244 | A1 | 3/2005 | Hein | |
| 2006/0162662 | A1 | 7/2006 | Sato et al. | |
| 2007/0092233 | A1 | 4/2007 | Wenk | |
| 2007/0272156 | A1 | 11/2007 | Noh | |
| 2008/0196667 | A1 * | 8/2008 | Fukunaga | C23C 14/243 118/724 |
| 2009/0038549 | A1 | 2/2009 | Englert | |
| 2009/0161719 | A1 | 6/2009 | Klemm et al. | |
| 2010/0080901 | A1 | 4/2010 | Hein et al. | |
| 2010/0330265 | A1 * | 12/2010 | Lee | C23C 14/243 118/715 |
| 2012/0236898 | A1 | 9/2012 | Keough | |
| 2014/0030435 | A1 | 1/2014 | Hein et al. | |
| 2014/0227443 | A1 | 8/2014 | Hoffmann et al. | |
| 2016/0305010 | A1 * | 10/2016 | Pei | C23C 14/243 |
| 2017/0067149 | A1 | 3/2017 | Deppisch | |
| 2019/0323119 | A1 | 10/2019 | Seo et al. | |
| 2020/0063254 | A1 * | 2/2020 | Kim | C23C 14/54 |
| 2021/0180178 | A1 | 6/2021 | Kim | |

FOREIGN PATENT DOCUMENTS

| | | | |
|---|---|---|---|
| CN | 109136855 | B | 3/2021 |
| EP | 0756020 | A1 | 1/1997 |
| JP | 2004214185 | A | 7/2004 |
| JP | 2006104513 | A | 4/2006 |
| KR | 20200113539 | A | 10/2020 |
| WO | 2018153853 | A1 | 8/2018 |

* cited by examiner

EVAPORATOR FOR EFFECTIVE SURFACE AREA EVAPORATION

CROSS-REFERENCES TO RELATED APPLICATIONS

This application claims priority to U.S. Provisional Patent Application No. 63/232,348, filed Aug. 12, 2021, which is incorporated herein by reference in its entirety.

BACKGROUND

Field

The present disclosure generally relates to an evaporation system for providing a gas for a reactive deposition process. More particularly, the present disclosure generally relates to a thermal evaporator design, which provides a uniform evaporation rate at relatively low temperatures.

Description of the Related Art

Processing of flexible substrates, such as plastic films or foils, is in high demand in the packaging industry, semiconductor industries, and other industries. Processing can include coating of a flexible substrate with a chosen material, such as a metal. The economical production of these coatings is frequently limited by the thickness uniformity necessary for the product, the reactivity of the coating materials, the cost of the coating materials, and the deposition rate of the coating materials. The most demanding applications generally involve deposition in a vacuum chamber for precise control of the coating thickness and the optimum optical properties. The high capital cost of vacuum coating equipment necessitates a high throughput of coated area for large-scale commercial applications. The coated area per unit time is typically proportional to the coated substrate width and the vacuum deposition rate of the coating material.

A process that can utilize a large vacuum chamber has tremendous economic advantages. Vacuum coating chambers, substrate treating and handling equipment, and pumping capacity, increase in cost less than linearly with chamber size. Therefore, the most economical process for a fixed deposition rate and coating design will utilize the largest substrate available. A larger substrate can generally be fabricated into discrete parts after the coating process is complete. In the case of products manufactured from a continuous web, the web is slit or sheet cut to either a final product dimension or a narrower web suitable for the subsequent manufacturing operations.

One technique used for deposition is thermal evaporation. Thermal evaporation takes place when a source material is heated in an open crucible within a vacuum chamber when a temperature is reached such that there is a sufficient vapor flux from the source for condensation on a cooler substrate. The source material can be heated indirectly by heating the crucible, or directly by a high current electron beam directed into the source material confined by the crucible. Thermal evaporation typically takes place at high temperatures, which can lead to high thermal loads on the substrate being processed. These high thermal loads can damage the substrate. One method for reducing thermal load includes cooling the crucible through radiative cooling. However, radiative cooling is typically very slow, which can lead to significant chamber downtime and an increase in cost of ownership.

Thus, there is a need for methods and systems for reducing the thermal load on substrates during thermal evaporation processes.

SUMMARY

The present disclosure generally relates to an evaporation system for providing a gas for a reactive deposition process. More particularly, the present disclosure generally relates to a thermal evaporator design, which provides a uniform evaporation rate at relatively low temperatures.

In one aspect an evaporation assembly is provided. The evaporation assembly includes a flat crucible for holding a material to be evaporated. The flat crucible includes a rectangular body defining an interior region for holding the material to be evaporated. The rectangular body has an opening through which the evaporated material can escape. The rectangular body has a length dimension and a width dimension defining an evaporation surface area. The evaporation assembly further includes an evaporator body fluidly coupled with the rectangular body. The evaporator body includes a top surface having a plurality of linear arrays of nozzles each nozzle having an opening defined by a diameter, wherein a total area of the openings defines a nozzle opening surface area and the evaporation surface area is greater than the nozzle opening surface area.

Implementations may include one or more of the following. An area ratio of the evaporation surface area to the nozzle opening surface area is from about 100 to about 330. An area ratio of the evaporation surface area to the nozzle opening surface area is greater than about 50:1. The top surface of the evaporator body is a planar surface. The top surface of the evaporator body has a zig-zag pattern defining longitudinal grooves. Opposing sidewalls of the evaporator body have a zig-zag pattern defining longitudinal grooves. The evaporator body includes a baffle region having a plurality of baffle plates, each baffle plate extending from a first sidewall of the evaporator body to a second sidewall of the evaporator body, wherein the first sidewall is opposite the second sidewall. The evaporator body further includes a heater region positioned below the baffle region. The heater region includes a plurality of tubular heaters. The evaporator body has a bottom surface that defines an opening which corresponds with the opening in the rectangular body. The evaporation assembly further includes a plurality of baffles dividing the rectangular body into separate compartments. Each baffle extends from a bottom surface of the rectangular body through the opening into the heater region between adjacent tubular heaters. Each compartment of the separate compartments corresponds to a linear array of nozzles of the plurality of linear arrays of nozzles. The evaporation assembly further includes a heat source in thermal contact with the evaporator body.

In another aspect, an evaporation assembly is provided. The evaporation assembly includes a flat crucible for holding a material to be evaporated. The evaporation assembly includes a rectangular body having a length and width dimension. The rectangular body includes a top surface having an opening through which evaporated material can escape. The rectangular body has a length dimension and a width dimension defining an evaporation surface area. The rectangular body further includes a bottom surface opposite the top surface, a first pair of opposing sidewalls extending upward from and perpendicular to the bottom surface, and a second pair of opposing sidewalls extending upward from and perpendicular to the bottom surface. The bottom surface, the first pair of opposing sidewalls, and the second pair of opposing sidewalls define an interior region for holding the material to be evaporated. The evaporation assembly further includes an evaporator body fluidly coupled with the rectangular body and having a length and width dimension. The evaporator body includes a heater region having a plurality of heating rods positioned therein. The evaporator body further includes a baffle region positioned above the heater region. The baffle region includes a linear array of nozzles for delivering the evaporated material, each nozzle having an opening defined by a diameter, wherein a total area of the openings defines a nozzle opening surface area and the evaporation surface area is greater than the nozzle opening surface area.

Implementations may include one or more of the following. An area ratio of the evaporation surface area to the nozzle opening surface area is from about 100 to about 330. An area ratio of the evaporation surface area to the nozzle opening surface area is greater than about 50:1. The top surface of the evaporator body is a planar surface. The top surface of the evaporator body has a zig-zag pattern defining longitudinal grooves. Opposing sidewalls of the evaporator body have a zig-zag pattern defining longitudinal grooves. A plurality of baffles extending along the length dimension of the rectangular body and dividing the rectangular body into separate compartments. Each baffle extends from a bottom surface of the rectangular body through the opening into the heater region between adjacent tubular heaters. Each compartment of the separate compartments corresponds to a linear array of nozzles of the plurality of linear arrays of nozzles. The evaporation assembly further includes a heat source in thermal contact with the evaporator body. Each baffle plate has a plurality of through-holes. The evaporation assembly further includes a heat source in thermal contact with the rectangular body.

In yet another aspect, a thermal evaporator is provided. The thermal evaporator includes an evaporator body having a length and width dimension. The evaporator body includes a heater region having a plurality of heating rods positioned therein. The evaporator body further includes a baffle region positioned above the heater region. The baffle region includes a linear array of nozzles for delivering the evaporated material, each nozzle having an opening defined by a diameter. The evaporator body further includes a crucible region positioned below the heater region. The crucible region is designed to hold the material to be evaporated. The length dimension and the width dimension define an evaporation surface area and a total area of the openings defines a nozzle opening surface area and the evaporation surface area is greater than the nozzle opening surface area.

Implementations may include one or more of the following. An area ratio of the evaporation surface area to the nozzle opening surface area is from about 100 to about 330. An area ratio of the evaporation surface area to the nozzle opening surface area is greater than about 50:1. The top surface of the evaporator body is a planar surface. The top surface of the evaporator body has a zig-zag pattern defining longitudinal grooves. Opposing sidewalls of the evaporator body have a zig-zag pattern defining longitudinal grooves. The thermal evaporator further includes a plurality of baffles extending along the length dimension of the evaporator body and dividing the evaporator body into separate compartments. Each baffle extends from a bottom surface of the evaporator body through the opening into the heater region between adjacent tubular heaters. Each compartment of the separate compartments corresponds to a linear array of nozzles of the plurality of linear arrays of nozzles. The thermal evaporator further includes a heat source in thermal contact with the evaporator body. Each baffle plate has a plurality of through-holes.

In another aspect, a non-transitory computer readable medium has stored thereon instructions, which, when executed by a processor, causes the processor to perform operations of the above apparatus and/or method.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
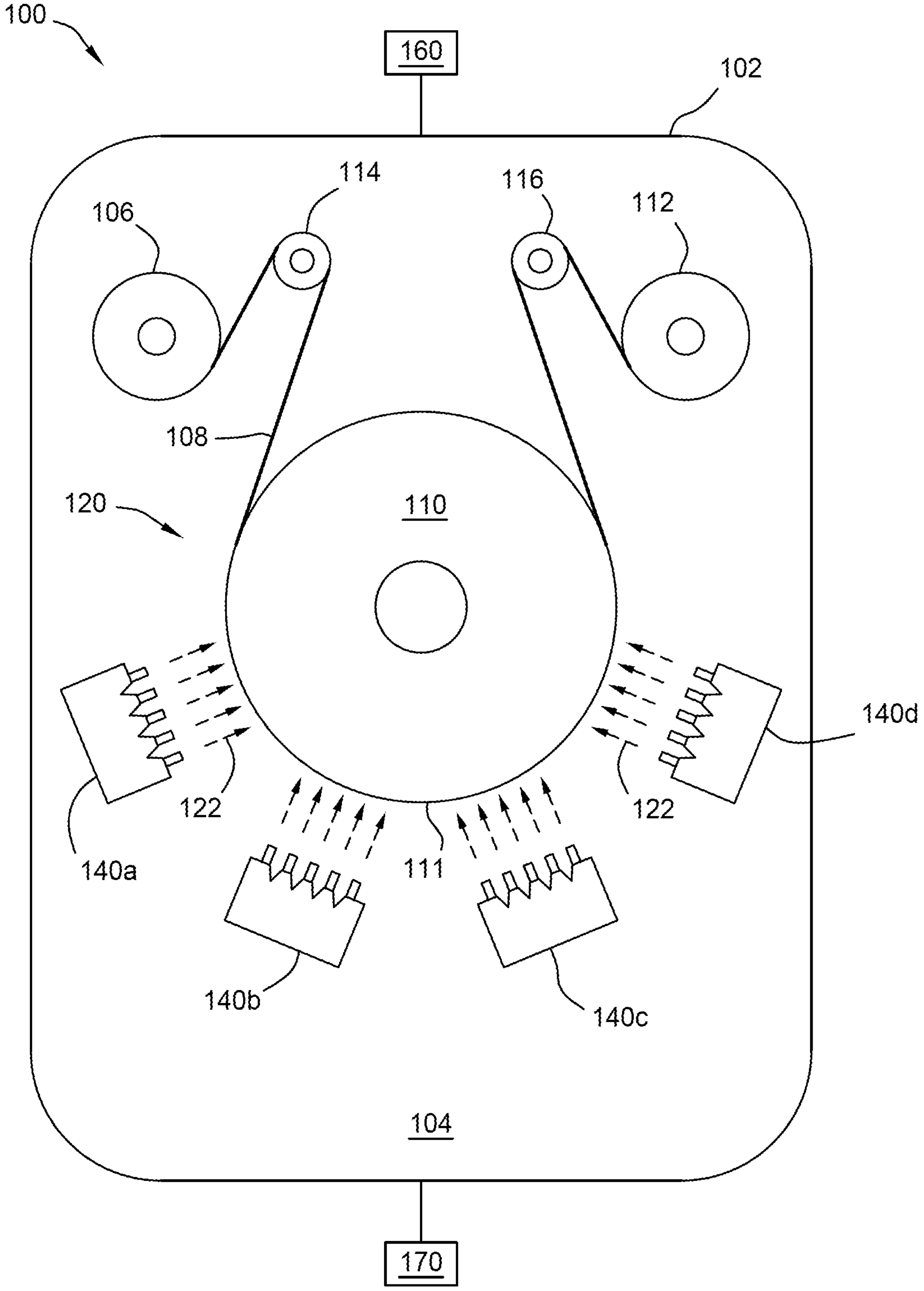
FIG. 1 illustrates a schematic side view of an evaporation system having an evaporation assembly according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Reference will now be made in detail to the various implementations of the present disclosure, one or more examples of which are illustrated in the figures. Within the following description of the drawings, the same reference numbers refer to the same components. Generally, only the differences with respect to individual implementations are described. Each example is provided by way of explanation of the present disclosure and is not meant as a limitation of the present disclosure. Further, features illustrated or described as part of one implementation can be used on or in conjunction with other implementations to yield yet a further implementation. It is intended that the description includes such modifications and variations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

According to some implementations, evaporation processes and evaporation apparatus for layer deposition on substrates, for example on flexible substrates, are provided. Thus, flexible substrates can be considered to include among other things films, foils, webs, strips of plastic material, metal, or other materials. Typically, the terms "web," "foil," "strip," "substrate" and the like are used synonymously. According to some implementations, components for evaporation processes, apparatuses for evaporation processes and evaporation processes according to implementations described herein can be provided for the above-described flexible substrates. However, they can also be provided in conjunction with non-flexible substrates such as glass substrates or the like, which are subject to the reactive deposition process from evaporation sources.

Vacuum web coating for anode pre-lithiation and solid metal anode protection involves thick (three to twenty micron) metallic (e.g., lithium) deposition on double-side-coated and calendered alloy-type graphite anodes and current collectors, for example, six micron or thicker copper foil, nickel foil, or metallized plastic web. One technique for deposition is thermal evaporation. Thermal evaporation readily takes place when a source material is heated in an open crucible within a vacuum chamber when a temperature is reached such that there is a sufficient vapor flux from the source for condensation on a cooler substrate. The source material can be heated indirectly by heating the crucible, or directly by a high current electron beam directed into the source material confined by the crucible.

Conventional evaporator systems often require high temperatures (e.g., approximately 200 to 1500 degrees Celsius) to evaporate, thereby placing a high thermal load on the processed web or substrate. Conventional evaporator systems, which use cooling drums also place higher tension on the web (e.g., 200 N to 800 N) to increase contact pressure on the cooling drum. The increased thermal loads and contact pressures can have several drawbacks. For example, the increased thermal loads and contact pressures can lead to wrinkling of the processed web, tearing of the web during processing, and impact the final product after coating. In addition, conventional evaporator systems often use cylindrical crucibles with cylindrical openings to supply evaporated material to the evaporator body of the thermal evaporator. The cylindrical openings often provide a limited surface area for evaporation. Thus in conventional evaporator systems, to achieve desired vapor pressure, higher temperatures are used. These higher temperatures place an additional thermal load on the web substrate. Thus it would be advantageous to have systems and methods for thermal evaporation, which expose the web to reduced thermal loads.

The thermal evaporator described herein includes a flat crucible design, which provides an increased surface area for evaporation of the material to be deposited relative to conventional designs. The increased surface area for evaporation means that more vapor of the evaporated material can be produced, which increases pressure inside the evaporator body leading to increased flow of the evaporated material out of the nozzles. The flat crucible can be attached to an evaporator body of the thermal evaporator. The flat crucible can be integrated within the evaporator body. The evaporator body can include a plurality of longitudinal grooves, which increase the surface area of the evaporator body. The thermal evaporator can include a plurality of baffles which divide the thermal evaporator into separate compartments. Each compartment can be configured to supply evaporated material to a corresponding linear array of nozzles, which ensures uniform pressure on each linear array of nozzles.

In one implementation which can be combined with other implementations, an evaporation assembly is provided. The evaporation assembly includes a flat crucible for holding a material to be evaporated. The flat crucible includes a rectangular body defining an interior region for holding the material to be evaporated. The rectangular body includes an opening through which the evaporated material can escape. The rectangular body has a length dimension and a width dimension that define an evaporation surface area. An evaporator body is fluidly coupled with the rectangular body.

The evaporator body has a top surface including a plurality of linear arrays of nozzles. Each nozzle has an opening defined by a diameter and a total area of the nozzle openings defines a nozzle opening surface area and the evaporation surface area is greater than the nozzle opening surface area. The nozzle opening surface areas can be calculated using the formula $n*\pi r^2$ where "n" represents the total number of nozzles and "r" represents the radius of the nozzle opening. The evaporation surface area of the flat crucible can be calculated by multiplying the length dimension "l" of the flat crucible times the width of the flat crucible "w". The "area ratio" is represented by "the surface area of the flat crucible"/"the nozzle opening surface area."

FIG. 1 illustrates a schematic side view of an evaporation system 100 including one or more evaporation assemblies 140*a*-140*d* (collectively 140), for example, thermal evaporators, according to one or more implementations of the present disclosure. The evaporation system 100 can be a roll-to-roll system adapted for depositing coatings on web materials, for example, for depositing metal containing film stacks according to the implementations described herein. In one example, the evaporation system 100 can be used for depositing metals or metal alloys. For example, the evaporation system 100 and evaporation assemblies 140 can be used for depositing metals or metal alloys. Examples of metal and metal alloys include but are not limited to alkali metals (e.g., lithium or sodium), selenium, magnesium, zinc, cadmium, aluminum, gallium, indium, thallium, tin, lead, antimony, bismuth, and tellurium, alkali earth metals, silver, or a combination thereof. These metals or metal alloys can be used for manufacturing energy storage devices, and particularly for film stacks for lithium-containing anode structures. The evaporation system 100 includes a chamber body 102 that defines a common processing environment 104 in which some or all of the processing actions for depositing coatings on web materials can be performed. In one example, the common processing environment 104 is operable as a vacuum environment. In another example, the common processing environment 104 is operable as an inert gas environment. In some examples, the common processing environment 104 can be maintained at a process pressure of $1\times10^{-3}$ mbar or below, for example, $1\times10^{-4}$ mbar or below.

The evaporation system 100 is constituted as a roll-to-roll system including an unwinding reel 106 for supplying a continuous flexible substrate 108 or web, a coating drum 110 over which the continuous flexible substrate 108 is processed, and a winding reel 112 for collecting the continuous flexible substrate 108 after processing. The coating drum 110 includes a deposition surface 111 over which the continuous flexible substrate 108 travels while material is deposited onto the continuous flexible substrate 108. The evaporation system 100 can further include one or more auxiliary transfer reels 114, 116 positioned between the unwinding reel 106, the coating drum 110, and the winding reel 112. According to one aspect, at least one of the one or more auxiliary transfer reels 114, 116, the unwinding reel 106, the coating drum 110, and the winding reel 112, can be driven and rotated by a motor. In one example, the motor is a stepper motor. Although the unwinding reel 106, the coating drum 110, and the winding reel 112 are shown as positioned in the common processing environment 104, it should be understood that the unwinding reel 106 and the winding reel 112 can be positioned in separate chambers or modules, for example, at least one of the unwinding reel 106 can be positioned in an unwinding module, the coating drum 110 can be positioned in a processing module, and the winding reel 112 can be positioned in a winding module.

The unwinding reel 106, the coating drum 110, and the winding reel 112 can be individually temperature controlled. For example, the unwinding reel 106, the coating drum 110, and the winding reel 112 can be individually heated using an internal heat source positioned within each reel or an external heat source.

In one implementation, which can be combined with other implementations, the one or more evaporation assemblies 140, for example, thermal evaporators, can be removably coupled with an evaporation shield (not shown). In another implementation, which can be combined with other implementations, the one or more evaporation assemblies 140 can be spaced apart from the coating drum 110. The one or more thermal evaporation assemblies 140 are positioned to deliver evaporated material onto the continuous flexible substrate 108 as the continuous flexible substrate 108 travels over the deposition surface 111 of the coating drum 110.

A deposition volume 120 is defined in between the one or more thermal evaporation assemblies 140 and the deposition surface 111 of the coating drum 110. In some implementations, the deposition volume 120 provides an isolated processing within the common processing environment 104 of the chamber body 102. The deposition volume 120 can be minimized and defined to conform to a web, for example, the continuous flexible substrate 108 that is wound on a cylindrical cooling drum, for example, the coating drum 110, a planar cooling plate, or in a free span orientation.

The one or more evaporation assemblies 140 will be described in greater detail with reference to FIGS. 2A-8. The one or more evaporation assemblies 140 are positioned to perform one or more processing operations to the continuous flexible substrate 108 or web of material. In one example, as depicted in FIG. 1, the one or more thermal evaporation assemblies 140 are radially disposed about the coating drum 110. In addition, arrangements other than radial are contemplated. In one implementation which can be combined with other implementations, the one or more thermal evaporation assemblies 140 include a lithium (Li) source. Further, the one or more thermal evaporation assemblies 140 can also include a source of an alloy of two or more metals. The material to be deposited can be evaporated, for example, by thermal evaporation techniques.

In operation, the one or more thermal evaporation assemblies 140 emit a plume of evaporated material 122, which is drawn to the continuous flexible substrate 108 where a film of deposited material is formed on the continuous flexible substrate 108.

In addition, although four thermal evaporation assemblies 140*a*-140*d* are shown in FIG. 1, it should be understood that any number of evaporation assemblies can be used. In addition, the evaporation system 100 can further include one or more additional deposition sources. For example, the one or more deposition sources as described herein include an electron beam source and additional sources, which can be selected from the group of CVD sources, PECVD sources, and various PVD sources. Exemplary PVD sources include sputtering sources, electron beam evaporation sources, and thermal evaporation sources. In addition, these additional deposition source can be positioned radially relative to the deposition surface 111 of the coating drum 110.

In one implementation of the present disclosure which can be combined with other implementations, the evaporation system 100 is configured to process both sides of the continuous flexible substrate 108. For example, additional evaporation assemblies similar to the one or more thermal evaporation assemblies 140 can be positioned to process the opposing side of the continuous flexible substrate 108. Although the evaporation system 100 is configured to process the continuous flexible substrate 108, which is horizontally oriented, the evaporation system 100 can be configured to process substrates positioned in different orientations, for example, the continuous flexible substrate 108 can be vertically oriented. In one implementation of the present disclosure which can be combined with other implementations, the continuous flexible substrate 108 is a flexible conductive substrate. In one implementation of the present disclosure which can be combined with other implementations, the continuous flexible substrate 108 includes a conductive substrate with one or more layers formed thereon. In one implementation of the present disclosure which can be combined with other implementations, the conductive substrate is a copper substrate.

The evaporation system 100 further includes a gas panel 160. The gas panel 160 uses one or more conduits (not shown) to deliver processing gases to the evaporation system 100. The gas panel 160 can include mass flow controllers and shut-off valves, to control gas pressure and flow rate for each individual gas supplied to the evaporation system 100. Examples of gases that can be delivered by the gas panel 160 include, but are not limited to, inert gases for pressure control (e.g., argon), etching chemistries including but not limited to diketones used for in-situ cleaning of the evaporation system 100, and deposition chemistries including but not limited to 1,1,1,2-Tetrafluoroethane or other hydrofluorocarbons and trimethylaluminum, titanium tetrachloride, or other metal organic precursors used for in-situ tens of nanometer thick reactive lithium mixed conductor surface modification.

The evaporation system 100 further includes a system controller 170 operable to control various aspects of the evaporation system 100. The system controller 170 facilitates the control and automation of the evaporation system 100 and can include a central processing unit (CPU), memory, and support circuits (or I/O). Software instructions and data can be coded and stored within the memory for instructing the CPU. The system controller 170 can communicate with one or more of the components of evaporation system 100 via, for example, a system bus. A program (or computer instructions) readable by the system controller 170 determines which tasks are performable on a substrate. In some aspects, the program is software readable by the system controller 170, which can include code for monitoring chamber conditions, including independent temperature control of the one or more evaporation assemblies 140. Although only a single system controller, the system controller 170 is shown, it should be appreciated that multiple system controllers can be used with the aspects described herein.

Figure 2A:
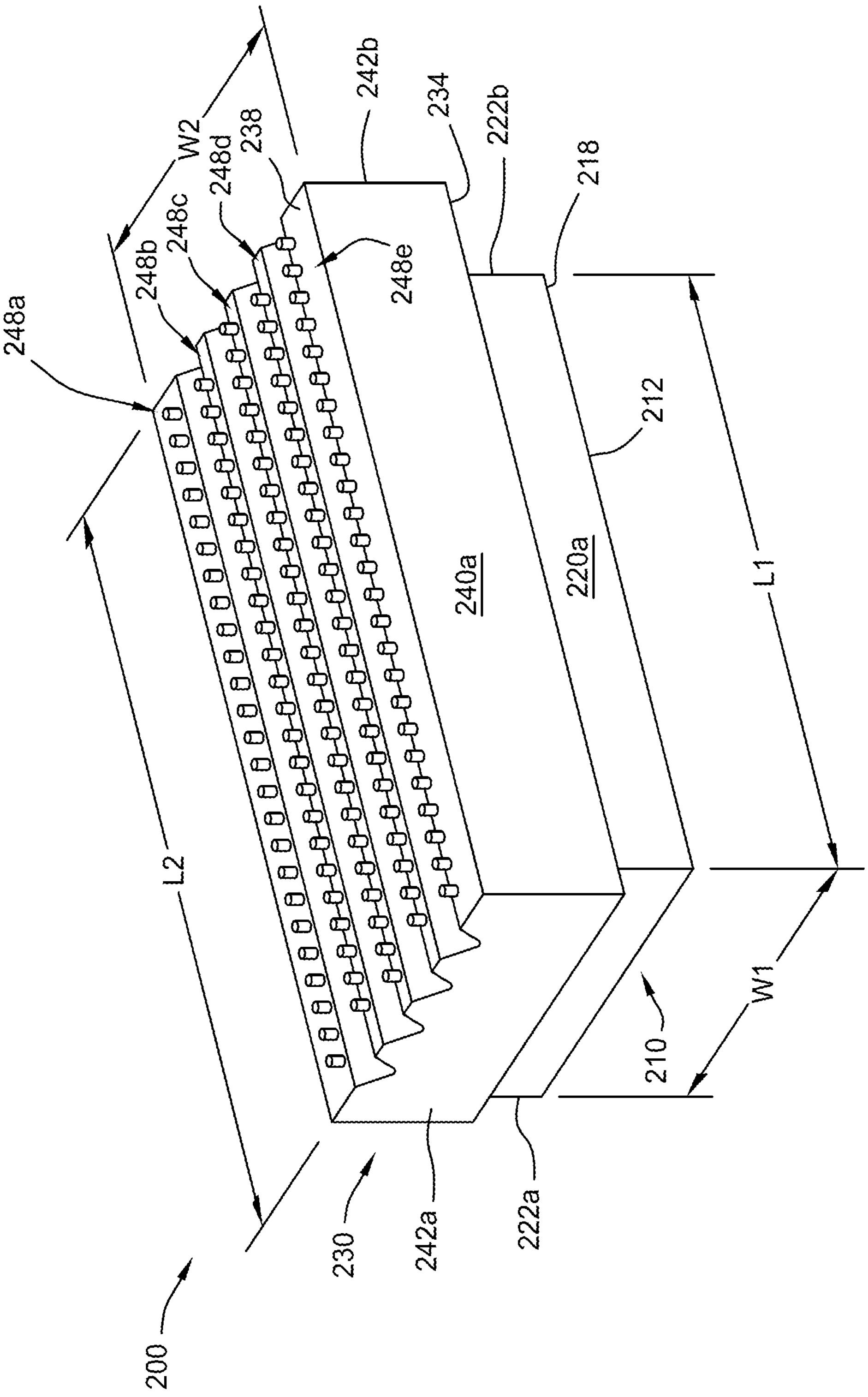
FIG. 2A illustrates a perspective view of an evaporation assembly including a flat crucible according to one or more implementations of the present disclosure.
Figure 2B:
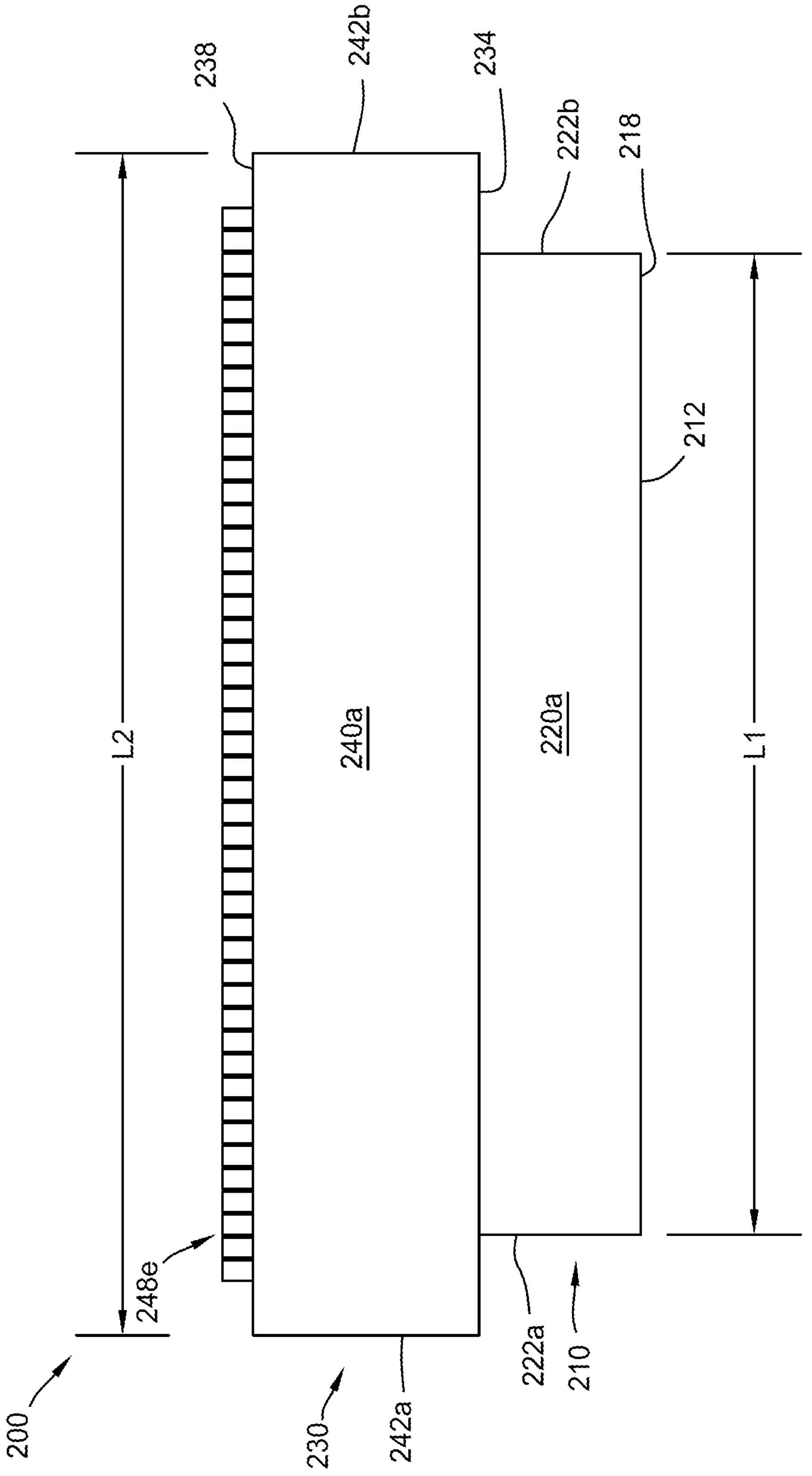
FIG. 2B illustrates a side view of the evaporation assembly of FIG. 2A according to one or more implementations of the present disclosure.
Figure 2C:
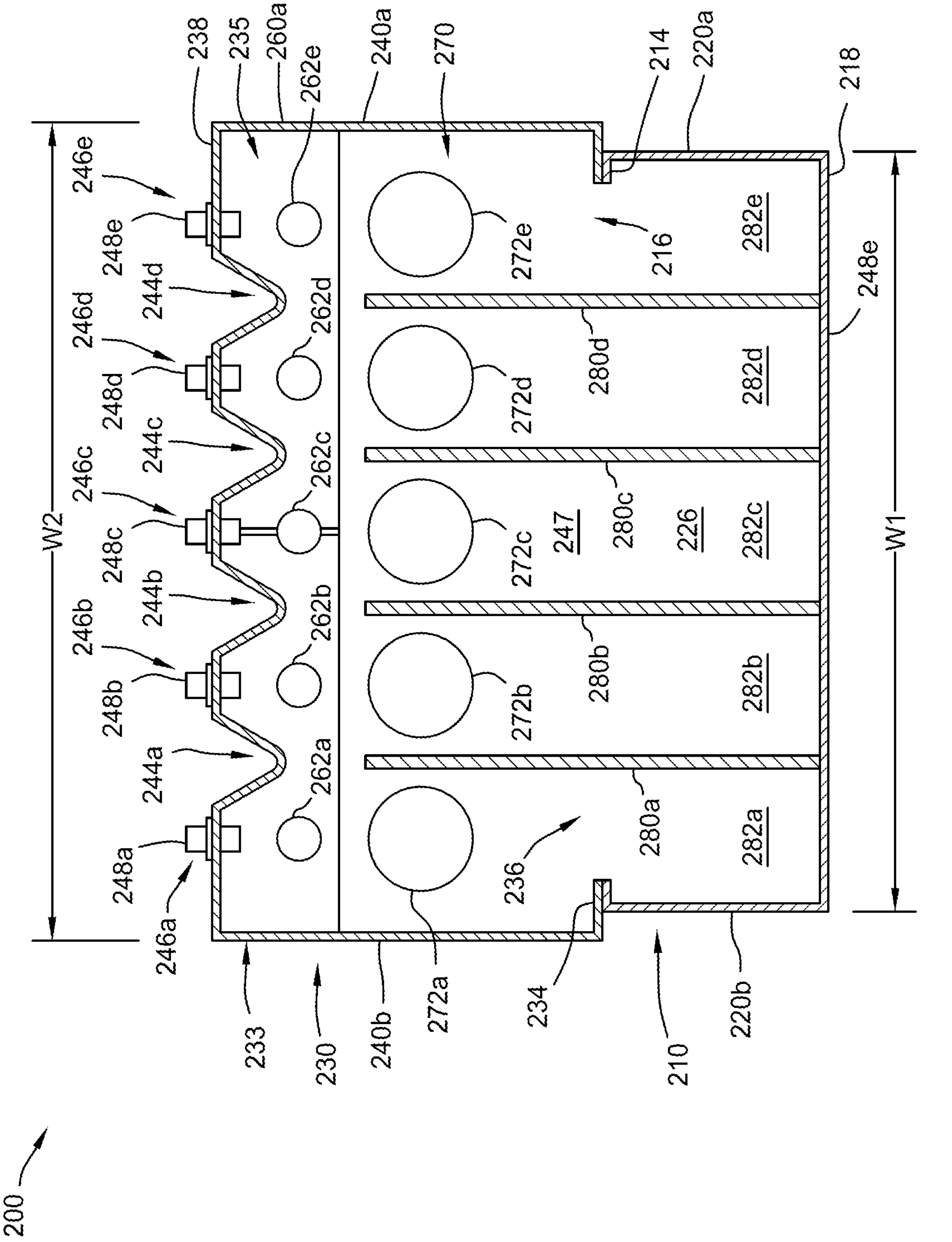
FIG. 2C illustrates a cross-sectional view of the evaporation assembly of FIG. 2A according to one or more implementations of the present disclosure.
Figure 2D:
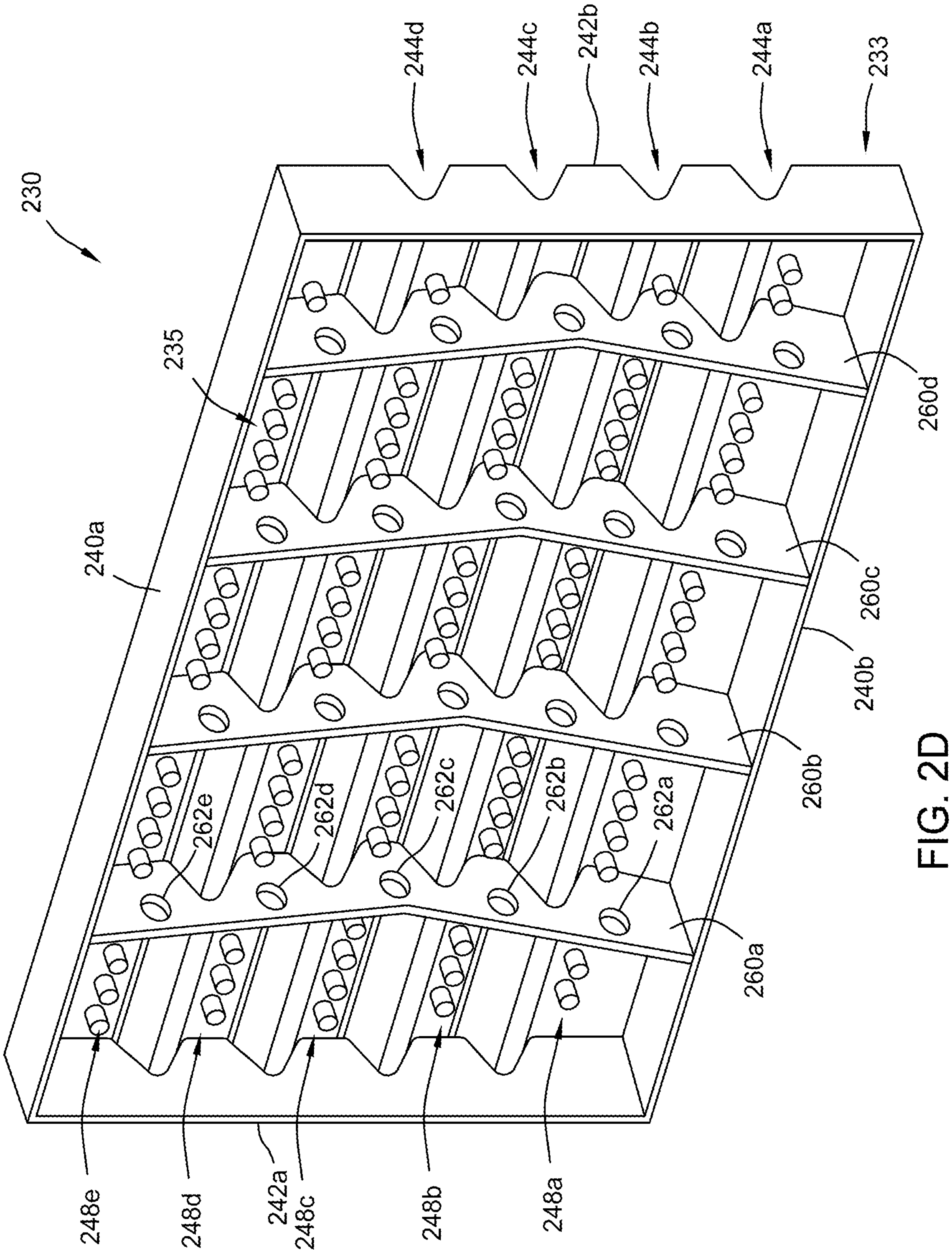
FIG. 2D illustrates a perspective view of a portion of the evaporation assembly of FIG. 2A according to one or more implementations of the present disclosure.

FIG. 2A illustrates a perspective view of an evaporation assembly 200, for example, a thermal evaporator, including a flat crucible 210 attached to an evaporator body 230 according to one or more implementations of the present disclosure. FIG. 2B illustrates a side view of the evaporation assembly 200 of FIG. 2A according to one or more implementations of the present disclosure. FIG. 2C illustrates a cross-sectional view of the evaporation assembly 200 of FIG. 2A according to one or more implementations of the present disclosure. FIG. 2D illustrates a perspective view of a portion of the evaporation assembly 200 of FIG. 2A according to one or more implementations of the present disclosure. The evaporation assembly 200 can be used in place of the thermal evaporation assembly 140 depicted in FIG. 1.

The flat crucible 210 is designed to hold a material to be evaporated, for example, a metal or metal alloy. The flat crucible 210 includes a crucible body 212 having a length "L1" dimension and a width "W1" dimension. Although the crucible body 212 is shown as a rectangular body, other suitable shapes for the crucible body 212 are also contemplated. Referring to FIG. 2C, the crucible body 212 includes a top surface 214 having an opening 216 through which the evaporated material can escape. The crucible body 212 further includes a bottom surface 218 opposite the top surface 214. The crucible body 212 further includes a first pair of opposing sidewalls 220*a*, 220*b* (collectively 220) extending upward from and perpendicular to the bottom surface 218. The first pair of opposing sidewalls 220*a*, 220*b* define the length dimension "L1" of the crucible body 212. The crucible body 212 further includes a second pair of opposing sidewalls 222*a*, 222*b* (collectively 222) extending upward from and perpendicular to the bottom surface 218. The second pair of opposing sidewalls 222 define the width dimension "W1" of the crucible body 212. Referring to FIG. 2C, the bottom surface 218, the first pair of opposing sidewalls 220, and the second pair of opposing sidewalls 222 define an interior region 226 for holding the material to be evaporated. The interior region 226 is operable for holding a material to be evaporated/deposited in a molten and/or liquid form. The material to be evaporated/deposited can be supplied to the interior region 226 of the flat crucible 210 from an external source. The crucible body 212 can be thermally coupled with an external heating source.

As shown in FIGS. 2A-2D, the evaporator body 230 is attached to the flat crucible 210. Any suitable attachment techniques can be used to attach the flat crucible 210 to the evaporator body 230. For example, the flat crucible 210 can be welded to the evaporator body 230. The flat crucible 210 can be bolted to the evaporator body 230. The flat crucible 210 can be removably attached to the evaporator body 230. In another implementation which can be combined with other implementations, the evaporator body 230 and the flat crucible 210 are machined from a single piece of material.

The flat crucible 210 and/or the evaporator body 230 can be formed of a material having high-thermal conductivity, such as molybdenum, graphite, stainless steel, or boron nitride. In one example, the flat crucible 210 is composed of pyrolytic boron nitride. Pyrolytic boron nitride is generally inert, can withstand high temperatures, is generally clean and does not contribute undesirable impurities to the vacuum environment, is generally transparent to certain wavelengths of infrared radiation, and can be fabricated into complex shapes, for example.

The evaporator body 230 is also fluidly coupled with the flat crucible 210 such that evaporated material from the flat crucible 210 can travel into the evaporator body 230. Referring to FIG. 2A, the evaporator body 230 has a length dimension "L2" and a width dimension "W2". Although the evaporator body 230 is shown as a rectangular body, other suitable shapes for the evaporator body 230 are also contemplated. Referring to FIG. 2C, the evaporator body 230 includes a bottom surface 234 having an opening 236 through which the evaporated material can enter the evaporator body 230 from the opening 216 of the flat crucible 210. As shown in FIG. 2C the opening 216 in the top surface 214 of the flat crucible 210 is aligned with the opening 236 in the bottom surface 234 of the evaporator body 230. In one implementation which can be combined with other implementations, the opening 216 and the opening 236 are the same size. In one implementation which can be combined with other implementations, the opening 216 and the opening 236 are different sizes.

The evaporator body 230 further includes a top surface 238 opposite the bottom surface 234. The evaporator body 230 further includes a first pair of opposing sidewalls 240*a*, 240*b* (collectively 240) extending upward from and perpendicular to the bottom surface 234. The first pair of opposing sidewalls 240*a*, 240*b* define the length dimension "L2" of the evaporator body 230. As shown in FIG. 2A and FIG. 2B, the evaporator body 230 further includes a second pair of opposing sidewalls 242*a*, 242*b* (collectively 242) extending upward from and perpendicular to the bottom surface 234. The second pair of opposing sidewalls 242 define a width dimension "W2" of the evaporator body 230. Referring to FIG. 2C, the bottom surface 234, the first pair of opposing sidewalls 240, and the second pair of opposing sidewalls 242 define an interior region 247 for holding the evaporated material.

In one implementation which can be combined with other implementations, the top surface 238 is a planar surface. In another implementation which can be combined with other implementations, the top surface 238 includes a plurality of longitudinal grooves 244*a*-244*d* (collectively 244) or a "zig-zag" pattern defining the plurality of longitudinal grooves 244 as shown in FIGS. 2A-2C. The grooved design of the top surface 238 increases the surface area of the evaporator body 230, which reduces the amount of radiative heat that the web substrate is exposed to. Although four longitudinal grooves 244*a*-244*d* are shown, the number of longitudinal grooves can be increased or decreased depending upon the desired surface area of the evaporator body 230. This increased surface area of the top surface 238 helps achieve higher vapor pressures at lower temperatures. Referring to FIG. 2A and FIG. 2C, the longitudinal grooves 244 in the top surface 238 extend from the sidewall 242*a* to sidewall 242*b* along the length defined by sidewalls 240. Referring to FIG. 2C, the longitudinal grooves 244 separate a plurality of longitudinal peaks 246*a*-246*e* (collectively 246). The longitudinal peaks 246 extend from the sidewall 242*a* to sidewall 242*b* along the length dimension "L2" defined by sidewalls 240. In one implementation which can be combined with other implementations, a distance between the longitudinal peak 246*a* and bottom of the longitudinal groove 244*a* is from about 80 millimeters to about 120 millimeters, for example, from about 90 millimeters to about 110 millimeters.

Each longitudinal peak 246*a*-246*e* supports a linear array of nozzles 248*a*-248*e* (collectively 248) configured to deliver evaporated material toward the surface of the web. Each nozzle of the linear array of nozzles 248 extends through the top surface 238. Each nozzle of the linear array of nozzles 248 includes an opening defined by a diameter. The opening of the nozzles can be any diameter sufficient to deliver the evaporated material at desired vapor pressures. In one implementation which can be combined with other implementations, each nozzle 248 has an opening defined by a diameter from about 1.2 millimeters to about 5 millimeters, for example, from about 4 millimeters to about 4.5 millimeters.

Referring to FIG. 2D, an upper portion 233 of the evaporator body 230 defines a baffle region 235 that includes a plurality of baffle plates 260*a*-260*d* (collectively 260). The baffle plates 260 divide the baffle region 235 into separate compartments. Each baffle plate 260 of the plurality of baffle plates 260*a*-260*d* extends along the width "W2" of the evaporator body 230 from the sidewall 242*a* to the sidewall 242*b*. Each baffle plate 260 includes a plurality of longitudinal grooves, which mirror the longitudinal grooves 244 of the top surface 238, and thus fit conformally with the top surface 238. Each baffle plate 260 includes a plurality of through-holes through which the material to be evaporated can travel. For example the baffle plate 260*a* includes through-holes 262*a*-262*e*. The baffle plates 260 divide the baffle region 235 into separate compartments, which helps achieve uniform flow of the evaporated material through the nozzles. Although four baffle plates 260 are shown in FIG. 2D, any number of baffle plates 260 can be used for delivering the material to be evaporated through the nozzles 248 uniformly. Any suitable attachment techniques can be used to attach the baffle plates 260 to the evaporator body 230. For example, the baffle plates 260 can be welded to the evaporator body 230. The baffle plates 260 can be bolted to the evaporator body 230. The baffle plates 260 can be removably attached to the evaporator body 230.

The evaporator body 230 further includes a heater region 270 defined between the baffle region 235 of the evaporator body 230 and the flat crucible 210. The heater region 270 contacts the baffle region 235. The heater region 270 includes a plurality of heaters 272*a*-272*e* (collectively 272). In one implementation which can be combined with other implementations, the heater 272 is a tubular heater, for example, a heating rod.

In one implementation which can be combined with other implementations, the thermal evaporation assembly 200 further includes a plurality of baffles 280*a*-280*d* (collectively 280). The plurality of baffles 280 each extend from the bottom surface 218 of the flat crucible 210 through the opening 216 into the heater region 270. Each baffle of the plurality of baffles 280 extends lengthwise from sidewall to sidewall, for example, the sidewall 242*a* to the sidewall 242*b*. In one implementation which can be combined with other implementations, each baffle of the plurality of baffles 280 extends into the interior region 247 in between the adjacent heaters 272. Each baffle of the plurality of baffles 280 divides the interior region 226 and the interior region 247 into separate compartments 282*a*-282*e* (collectively 282). In one implementation, which can be combined with other implementations, at least one of the plurality of baffles 280 includes one or more through-holes, which allow the molten or liquid metal or metal alloy to flow between adjacent compartments. Each compartment 282*a*-282*e* can be configured to supply evaporated material to a corresponding linear array of nozzles 248*a*-248*e*. For example, the compartment 282*a* supplies evaporated material to the linear array of nozzles 248*a*. Dividing the interior region 226 into separate compartments ensures uniform pressure on each linear array of nozzles 248. Particularly in implementations where the evaporation assembly 200 is tilted, the baffle design holds and equally distributes the liquid metal or metal alloy across all the nozzles which improves thickness uniformity. In tilted implementations of the evaporation assembly without baffles, the molten or liquid metal or metal alloy flows to the lowest point, which leads to non-uniform pressure between different linear arrays of nozzles 248*a*-248*e*.

In one example, an area ratio of the evaporation surface area of the crucible to the nozzle opening surface area is from about 40:1 to about 400:1; from about 50:1 to about 350:1; and from about 100:1 to about 330:1. An area ratio of the evaporation surface area of the crucible to the nozzle opening surface area is greater than about 40:1; greater than about 50:1; greater than about 70:1; greater than about 100:1; greater than about 150:1; greater than about 170:1; greater than about 200:1; greater than about 250:1; greater than about 300:1; or greater than about 400:1.

Figure 3:
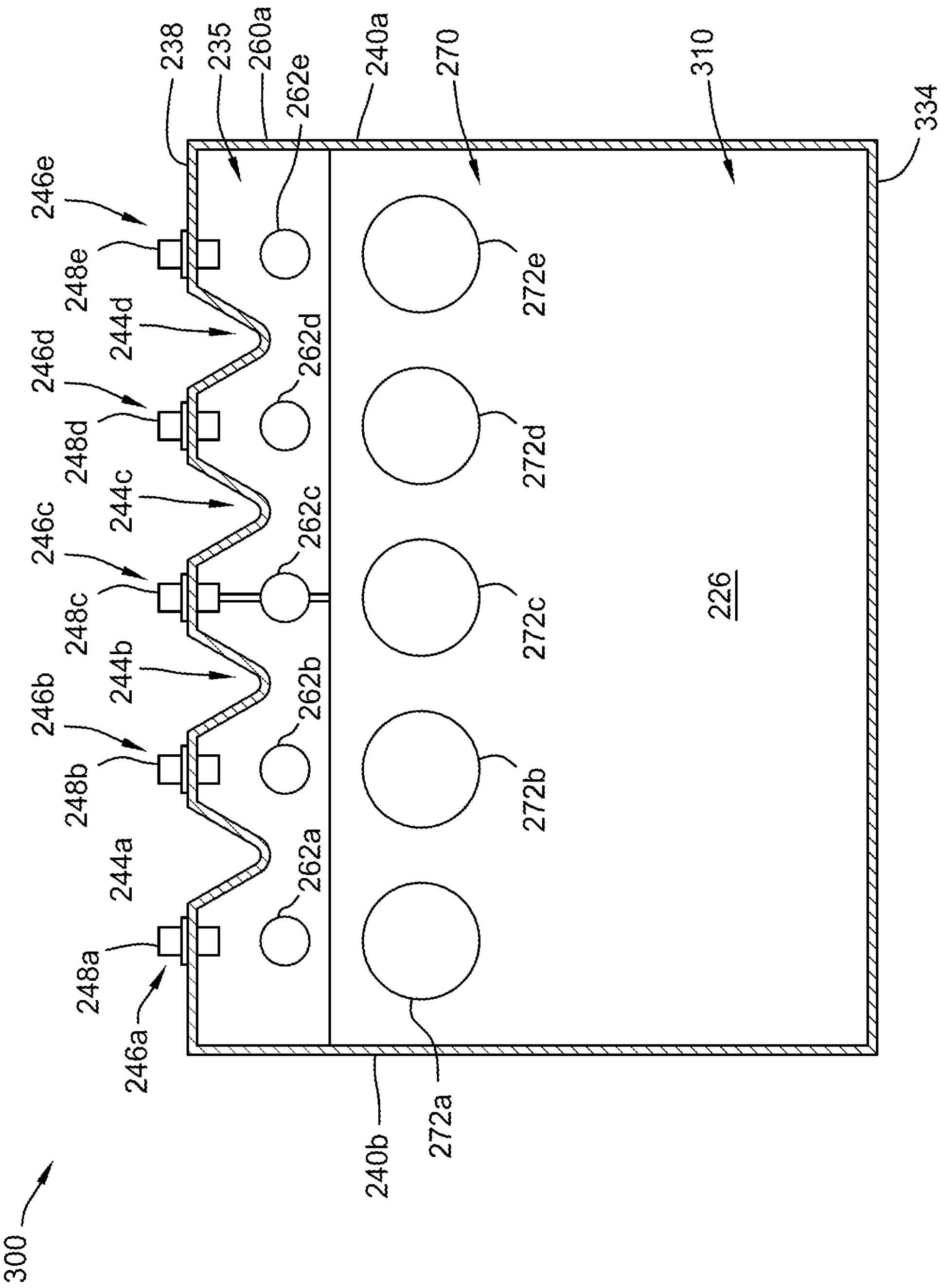
FIG. 3 illustrates a cross-sectional view of an evaporation assembly including an integrated flat crucible according to one or more implementations of the present disclosure.

FIG. 3 illustrates a cross-sectional view of an evaporation assembly 300 for example, a thermal evaporator, according to one or more implementations of the present disclosure. The evaporation assembly 300 is similar to the evaporation assembly 200 except that a crucible region 310 of the evaporation assembly 300 is integrated within the evaporator body 230 of the evaporation assembly 300. The crucible region 310 is positioned below the heater region 270 and is designed to hold the material to be evaporated. A bottom surface 334 of the evaporator body 230 depicted in FIG. 3 is a solid piece. The evaporation assembly 300 can be used in place of the evaporation assembly 140 depicted in FIG. 1.

Figure 4:
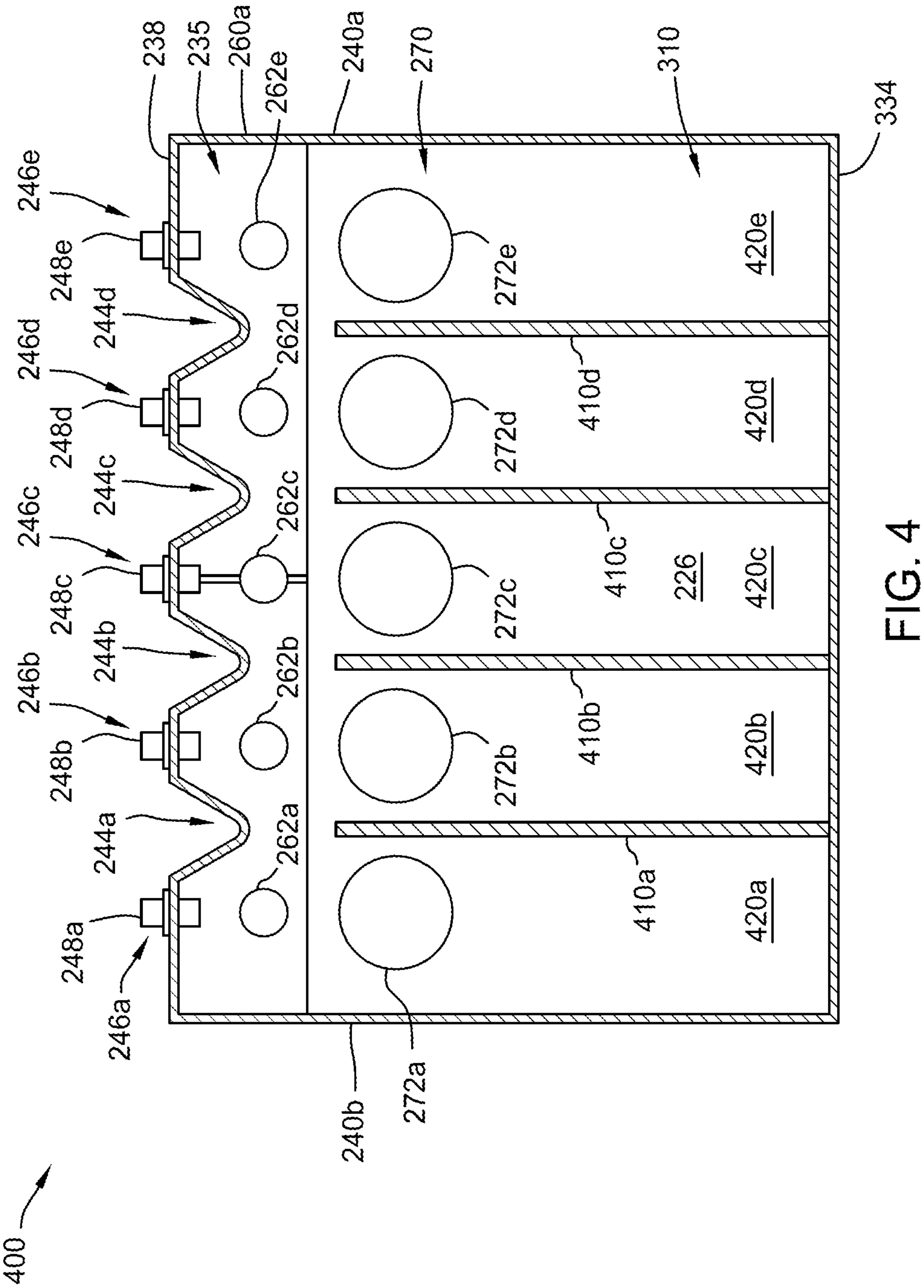
FIG. 4 illustrates a cross-sectional view of an evaporation assembly including an integrated flat crucible according to one or more implementations of the present disclosure.

FIG. 4 illustrates a cross-sectional view of an evaporation assembly 400, for example, a thermal evaporator, according to one or more implementations of the present disclosure. The evaporation assembly 400 can be used in place of the evaporation assembly 140 depicted in FIG. 1. The evaporation assembly 400 is similar to the evaporation assembly 300 except that the evaporation assembly 400 includes a plurality of baffles 410*a*-410*d* (collectively 410). The plurality of baffles 410 each extend from the bottom surface 334 of the evaporator body 230 into the heater region 270. Each baffle of the plurality of baffles 410 extends lengthwise from sidewall to sidewall, for example, the sidewall 242*a* to the sidewall 242*b*. In one implementation which can be combined with other implementations, each baffle of the plurality of baffles 410 extends into the interior region 247 in between the adjacent heaters 272. Each baffle of the plurality of baffles 410 divides the interior region 226 and the interior region 247 into separate compartments 420*a*-420*e* (collectively 420). Each compartment 420*a*-420*e* can be configured to supply evaporated material to a corresponding linear array of nozzles 248*a*-248*e*. For example, the compartment 420*a* supplies evaporated material to the linear array of nozzles 248*a*. Dividing the interior region 226 into separate compartments ensures uniform pressure on each linear array of nozzles 248.

Figure 5A:
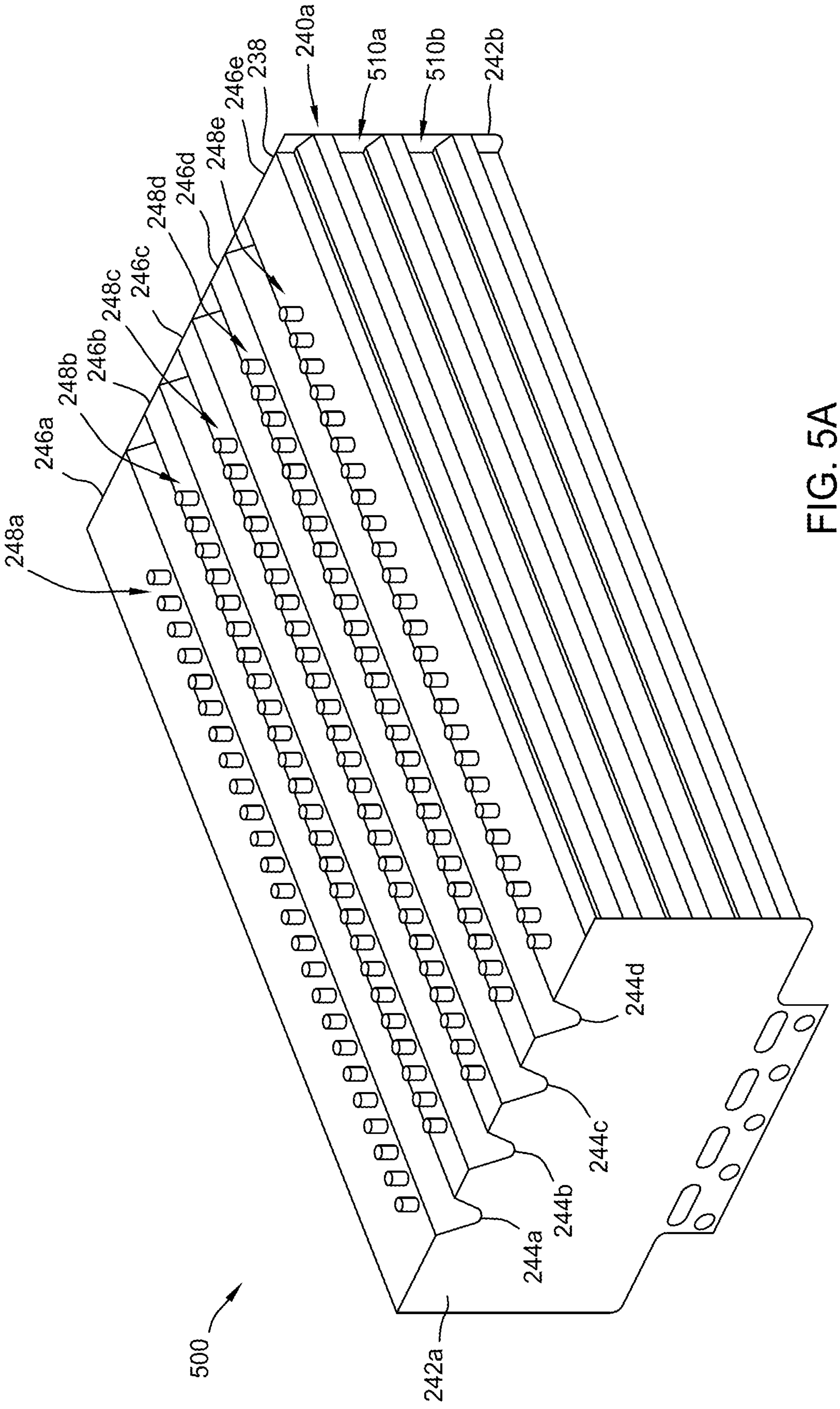
FIG. 5A illustrates a perspective view of an evaporation assembly including an integrated flat crucible according to one or more implementations of the present disclosure.
Figure 5B:
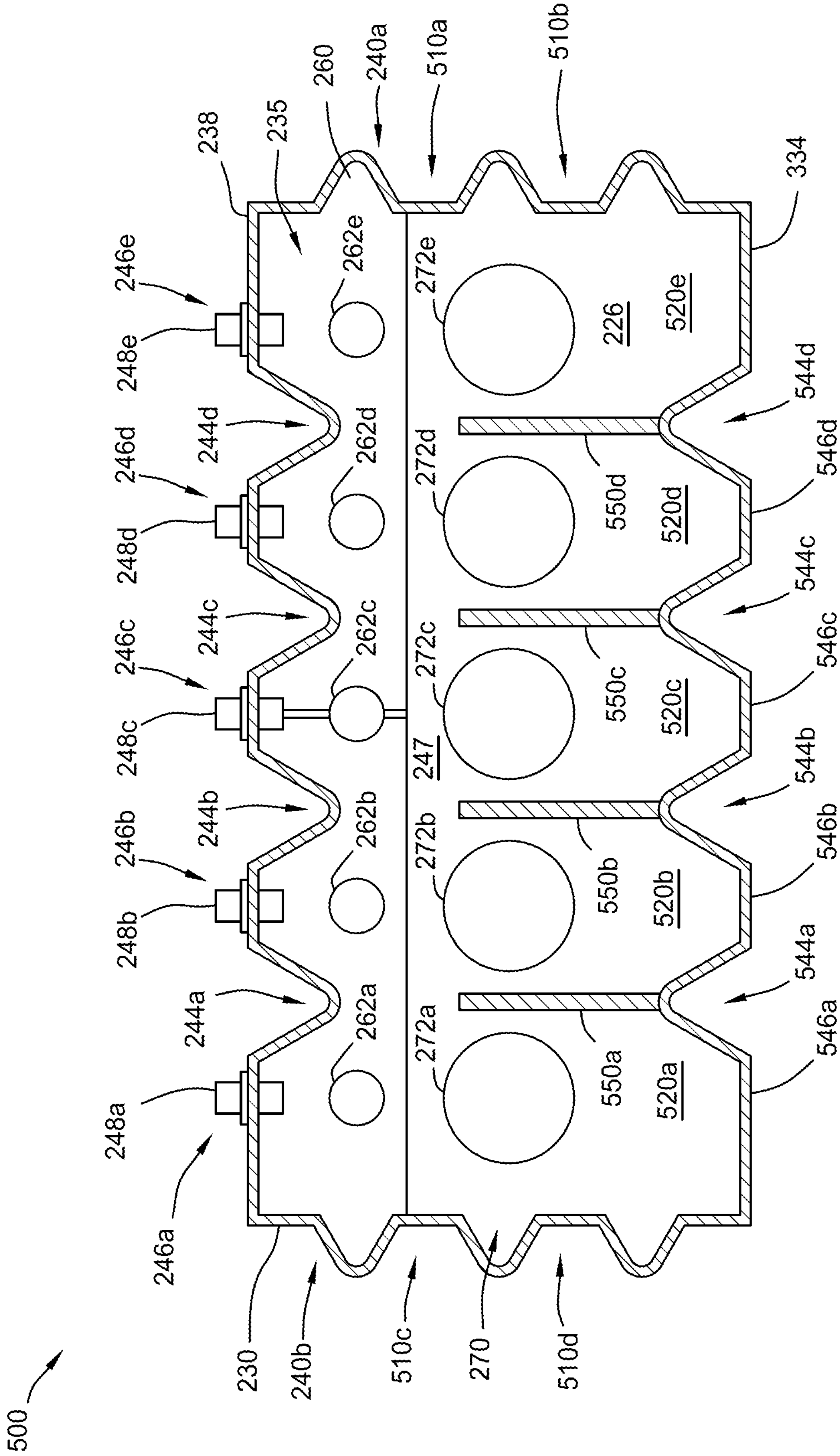
FIG. 5B illustrates a cross-sectional view of the evaporation assembly of FIG. 5A according to one or more implementations of the present disclosure.

FIG. 5A illustrates a perspective view of an evaporation assembly 500, for example, a thermal evaporator, including an integrated flat crucible region according to one or more implementations of the present disclosure. FIG. 5B illustrates a cross-sectional view of the evaporation assembly 500 of FIG. 5A according to one or more implementations of the present disclosure. The evaporation assembly 500 can be used in place of the evaporation assembly 140 depicted in FIG. 1. The evaporation assembly 500 is similar to the evaporation assembly 300 except that the evaporation assembly 500 includes a plurality of longitudinal grooves or a zig-zag pattern in both the sidewalls 240*a*, 240*b* and the bottom surface 334. As discussed above, the grooved design in both the sidewalls 240*a*, 240*b* and the bottom surface 334 helps to increase the surface area of the evaporator body 230. This increased surface area helps achieve higher vapor pressure at lower temperatures, which reduces the amount of radiative heat that the web substrate is exposed to and also enables temperature ramp-up and ramp-down in a short timeframe. The sidewall 240*a* includes longitudinal grooves 510*a*, 510*b* and the sidewall 240*b* includes longitudinal grooves 510*c*, 510*d*. Although two longitudinal grooves 510*a*, 510*b* and 510*c*, 510*d* are shown in each respective sidewall 240*a*, 240*b*, the number of longitudinal grooves can be increased or decreased depending upon the desired surface area of the evaporator body 230. The longitudinal grooves 510*a*-510*d* extend from the sidewall 242*a* to sidewall 242*b* along the length defined by sidewalls 240*a*, 240*b*.

Similar to the top surface 238, the bottom surface 334 also includes a plurality of longitudinal grooves 544*a*-544*d*. Although four longitudinal grooves 544*a*-544*d* are shown, the number of longitudinal grooves can be increased or decreased depending upon the desired surface area of the evaporator body 230. This increased surface area of the bottom surface 334 achieves lower temperature at higher vapor pressures. Referring to FIGS. 5A-5B, the longitudinal grooves 544 in the bottom surface 334 extend from the sidewall 242*a* to sidewall 242*b* along the length defined by the sidewalls 240*a*, 240*b*. Referring to FIG. 5B, the longitudinal grooves 544 separate a plurality of longitudinal peaks 546*a*-546*e* (collectively 546). The longitudinal peaks 546 extend from the sidewall 242*a* to sidewall 242*b* along the length defined by the sidewalls 240*a*, 240*b*. In one implementation which can be combined with other implementations, a distance between the longitudinal peak 546*a* and bottom of the longitudinal groove 544*a* is from about 80 millimeters to about 120 millimeters, for example, from about 90 millimeters to about 110 millimeters.

In one implementation which can be combined with other implementations, the evaporation assembly 500 depicted in FIG. 5B further includes a plurality of baffles 550*a*-550*d* (collectively 550). The plurality of baffles 550 each extend from the bottom surface 334 of the evaporator body 230 into the heater region 270. Each baffle of the plurality of baffles 510 extends lengthwise from sidewall to sidewall, for example, the sidewall 242*a* to the sidewall 242*b*. In one implementation which can be combined with other implementations, each baffle of the plurality of baffles 510 extends into the interior region 247 in between the adjacent heaters 272. Each baffle of the plurality of baffles 510 divides the interior region 226 and the interior region 247 into separate compartments 520*a*-520*e* (collectively 520). Each compartment 520*a*-520*e* can be configured to supply evaporated material to a corresponding linear array of nozzles 248*a*-248*e*. For example, the compartment 520*a* supplies evaporated material to the linear array of nozzles 248*a*. Dividing the interior region 226 into separate compartments ensures uniform pressure on each linear array of nozzles 248.

Figure 6A:
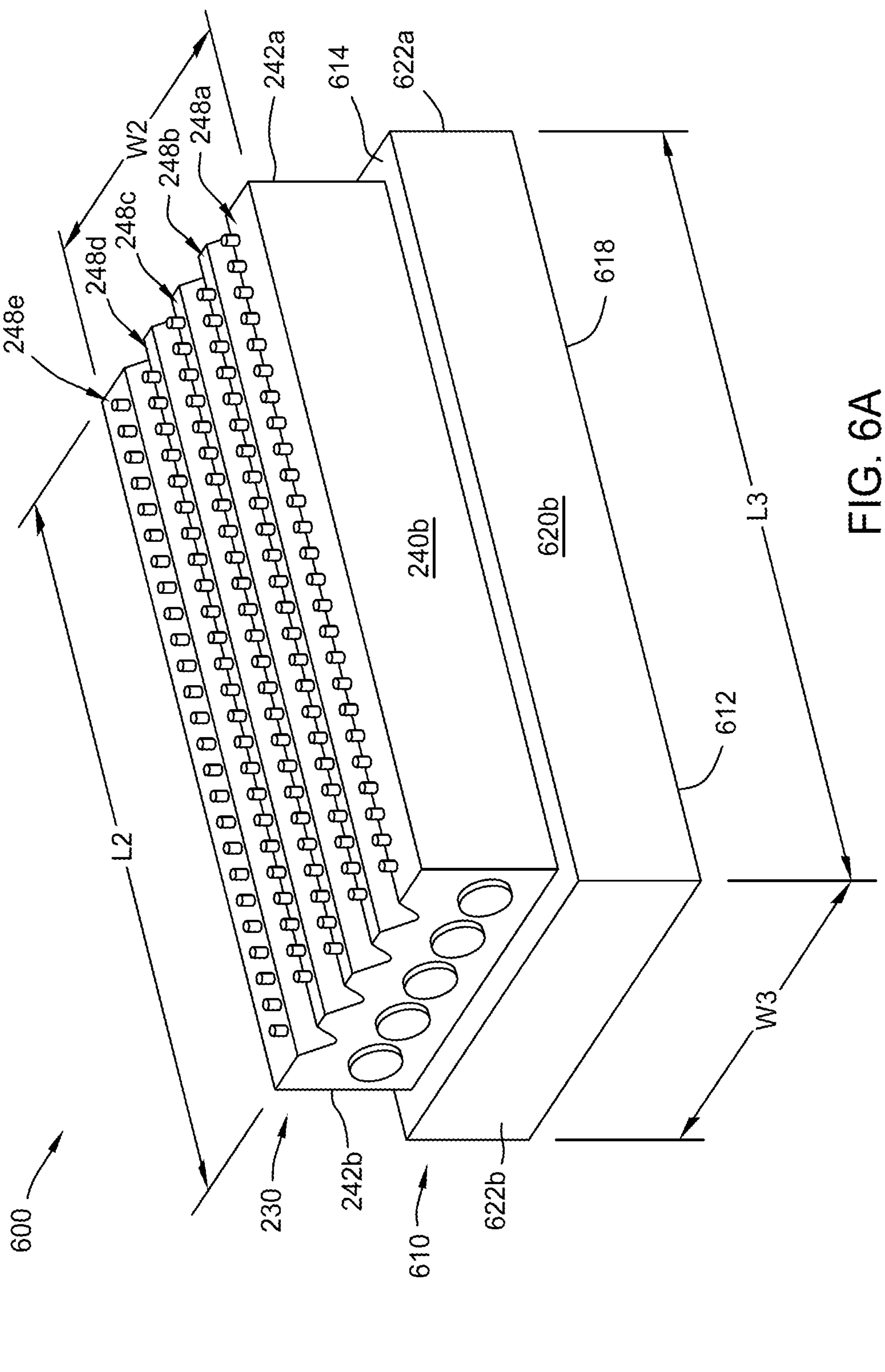
FIG. 6A illustrates a perspective view of an evaporation assembly including a flat crucible according to one or more implementations of the present disclosure.
Figure 6B:
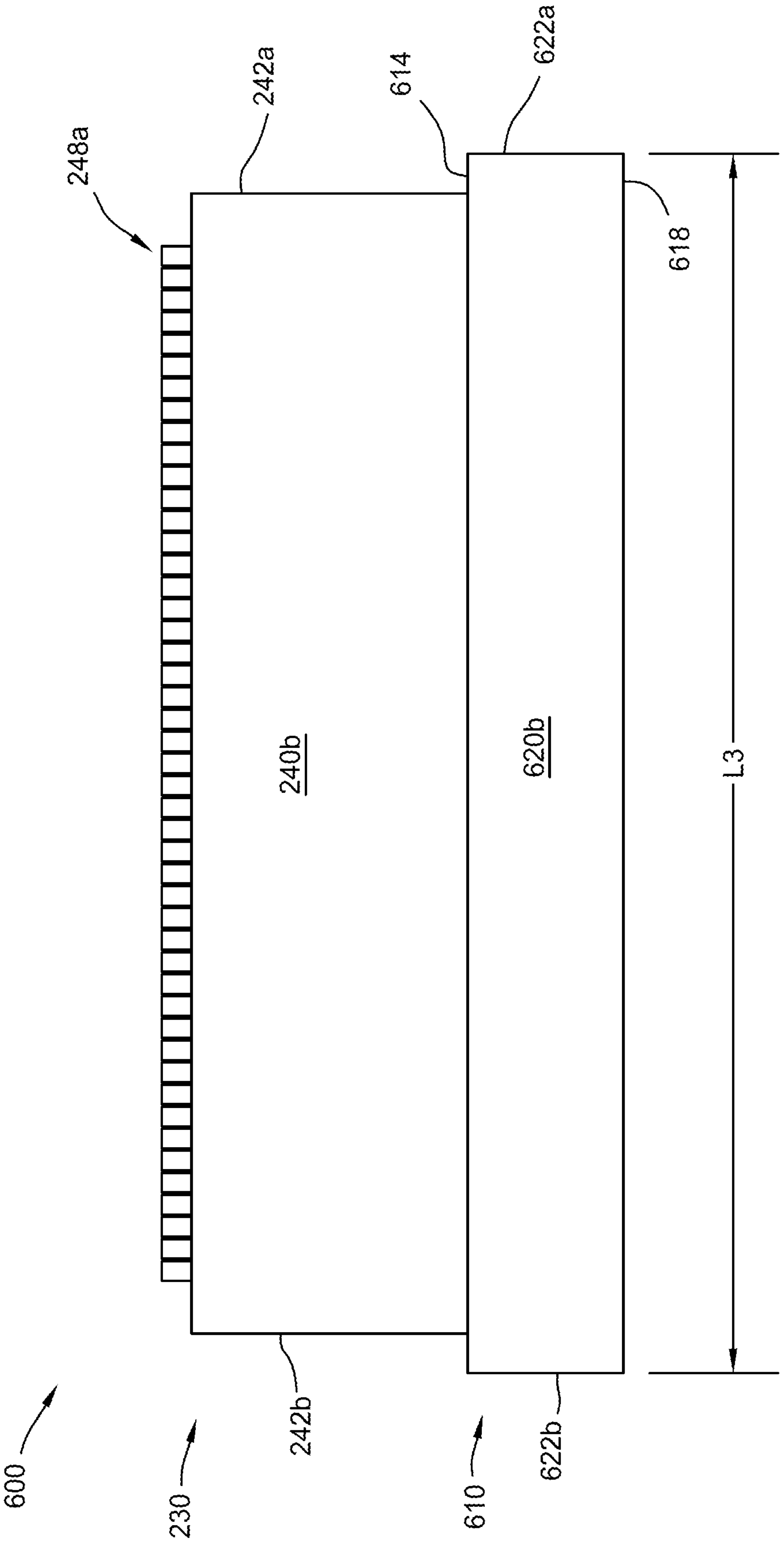
FIG. 6B illustrates a side view of the evaporation assembly of FIG. 6A according to one or more implementations of the present disclosure.
Figure 6C:
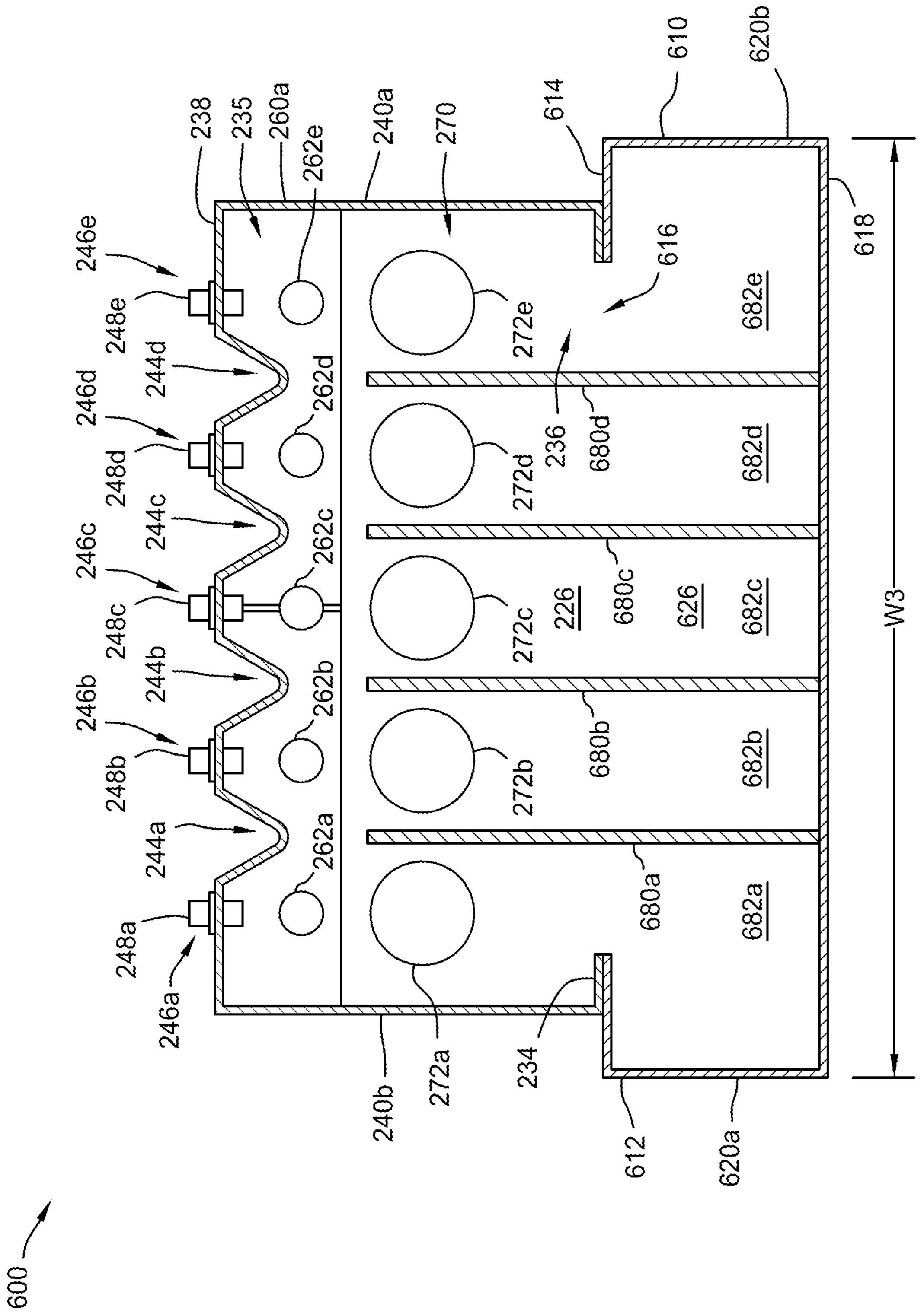
FIG. 6C illustrates a cross-sectional view of the evaporation assembly of FIG. 6A according to one or more implementations of the present disclosure.

FIG. 6A illustrates a perspective view of an evaporation assembly 600 including an enlarged flat crucible 610 according to one or more implementations of the present disclosure. FIG. 6B illustrates a side view of the evaporation assembly 600 of FIG. 6A according to one or more implementations of the present disclosure. FIG. 6C illustrates a cross-sectional view of the evaporation assembly of FIG. 6A according to one or more implementations of the present disclosure. The evaporation assembly 600 can be used in place of the evaporation assembly 140 depicted in FIG. 1. The evaporation assembly 600 is similar to the evaporation assembly 200 except that the evaporation assembly 600 replaces the flat crucible 210 with an enlarged flat crucible 610.

The enlarged flat crucible 610 is designed to hold a material to be evaporated, for example, a metal or metal alloy. The enlarged flat crucible 610 includes a crucible body 612 having a length dimension “L3” and a width dimension “W3”. As depicted in FIGS. 6A-6C, the crucible body 612 has a larger length dimension “L3” and a larger width dimension “W3” than the length dimension “L2” and the width dimension “W2” of the evaporator body 230. Although the crucible body 612 is shown as a rectangular body, other suitable shapes for the crucible body 612 are also contemplated. Referring to FIG. 6C, the crucible body 612 includes a top surface 614 having an opening 616 through which the evaporated material can escape. The crucible body 612 further includes a bottom surface 618 opposite the top surface 614. The crucible body 612 further includes a first pair of opposing sidewalls 620*a*, 620*b* (collectively 620) extending upward from and perpendicular to the bottom surface 618. The first pair of opposing sidewalls 620*a*, 620*b* define a length of the crucible body 612. The crucible body 612 further includes a second pair of opposing sidewalls 622*a*, 622*b* (collectively 622) extending upward from and perpendicular to the bottom surface 618. The second pair of opposing sidewalls 622 define a width of the crucible body 612. Referring to FIG. 6C, the bottom surface 618, the first pair of opposing sidewalls 620, and the second pair of opposing sidewalls 622 define an interior region 626 for holding the material to be evaporated. The interior region 626 is operable for holding a material to be evaporated/deposited in a molten and/or liquid form. The material to be evaporated/deposited can be supplied to the interior region 626 of the enlarged flat crucible 610 from an external source. The crucible body 612 can be thermally coupled with an external heating source.

The evaporator body 230 is also fluidly coupled with the enlarged flat crucible 610 such that evaporated material from the enlarged flat crucible 610 can travel into the evaporator body 230. As shown in FIG. 6C the opening 616 in the top surface 614 of the enlarged flat crucible 610 is aligned with the opening 236 in the bottom surface 234 of the evaporator body 230. In one implementation which can be combined with other implementations, the opening 616 and the opening 236 are the same size. In one implementation which can be combined with other implementations, the opening 616 and the opening 236 are different sizes.

In one implementation which can be combined with other implementations, the thermal evaporation assembly 600 further includes a plurality of baffles 680*a*-680*d* (collectively 680). The plurality of baffles 680 each extend from the bottom surface 618 of the enlarged flat crucible 610 through the opening 616 into the heater region 270. Each baffle of the plurality of baffles 680 extends lengthwise from sidewall to sidewall, for example, the sidewall 622*a* to the sidewall 622*b*. In one implementation which can be combined with other implementations, each baffle of the plurality of baffles 680 extends into the interior region 247 in between the adjacent heaters 272. Each baffle of the plurality of baffles 680 divides the interior region 226 and the interior region 247 into separate compartments 682*a*-682*e* (collectively 682). Each compartment 682*a*-682*e* can be configured to supply evaporated material to the corresponding linear array of nozzles 248*a*-248*e*. For example, the compartment 682*a* supplies evaporated material to the linear array of nozzles 248*a*. Dividing the interior region 626 into separate compartments ensures uniform pressure on each linear array of nozzles 248.

In one example, the evaporator body 230 has a width dimension "W2" of 24 centimeters and a length dimension "L2" of 30 centimeters, which equates to a surface area of 720 centimeters$^2$. The enlarged flat crucible 610 has a width dimension "W3" of 30 centimeters and a length dimension "L3" of 36 centimeters, which equates to a surface area of 1,080 centimeters$^2$. The ratio of the surface area of the enlarged flat crucible 610 to the surface area of the evaporator body 230 is 6:4 or 1.5. Thus 50% more surface area is exposed to the nozzles.

Figure 7:
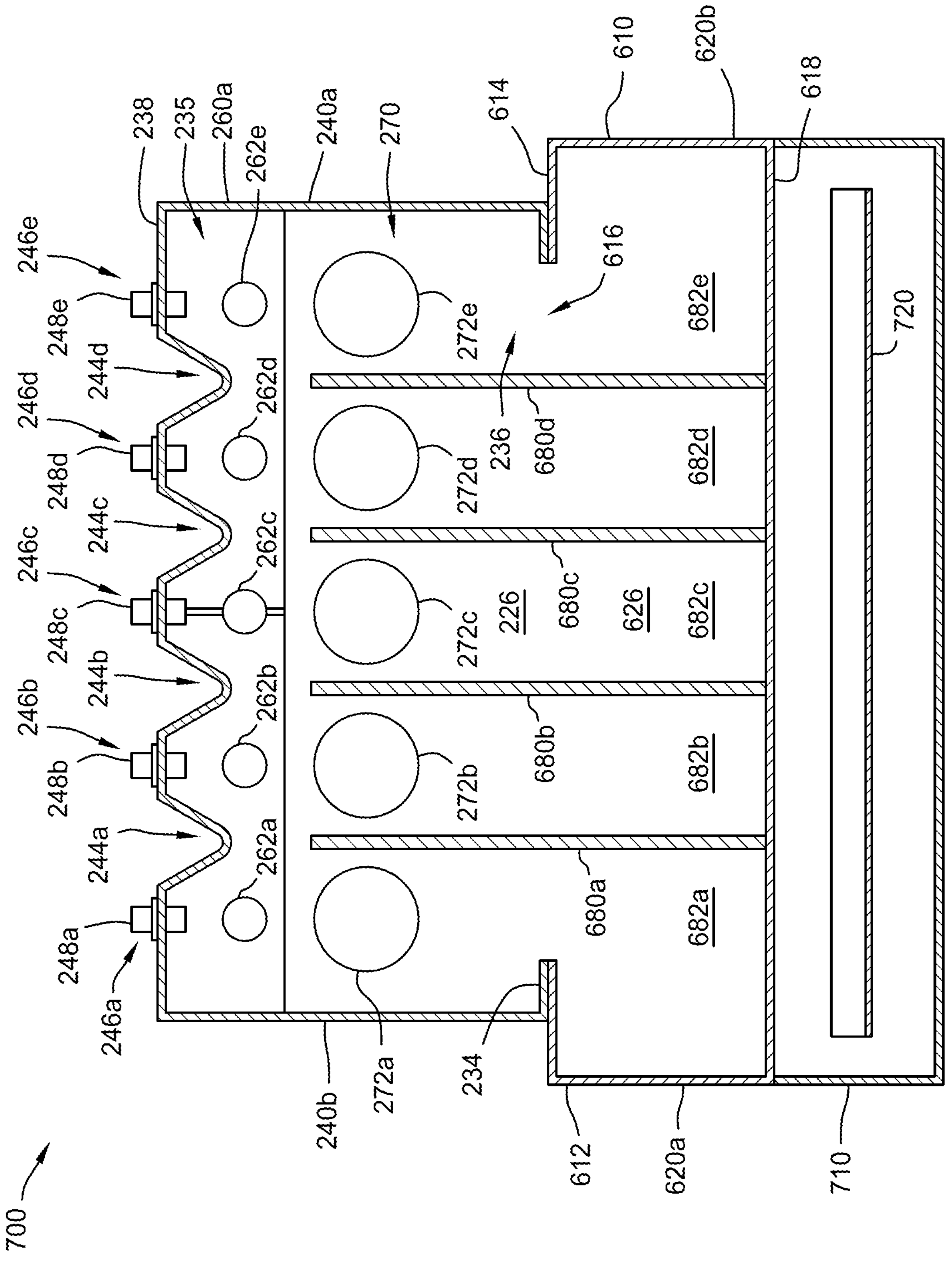
FIG. 7 illustrates a schematic cross-sectional view of another evaporation assembly according to one or more implementations of the present disclosure.

FIG. 7 illustrates a schematic cross-sectional view of another evaporation assembly 700 according to one or more implementations of the present disclosure. The evaporation assembly 700 can be used in place of the evaporation assembly 140 depicted in FIG. 1. The evaporation assembly 700 includes a heater body 710 coupled with the enlarged flat crucible 610. The heater body 710 includes a heater or a heater element 720 for vaporizing the material to be evaporated in the enlarged flat crucible 610. The heater element 720 can be any suitable heater for achieving desired temperatures. In one example, the heater element 720 is a resistive heater. In one implementation which can be combined with other implementations, the heater body 710 is coupled with the bottom surface 618 of the flat crucible. Any suitable attachment techniques can be used to attach the enlarged flat crucible 610 to the heater body 710. For example, the enlarged flat crucible 610 can be welded to the heater body 710. The enlarged flat crucible 610 can be bolted to the heater body 710. The enlarged flat crucible 610 can be removably attached to the heater body 710.

Figure 8:
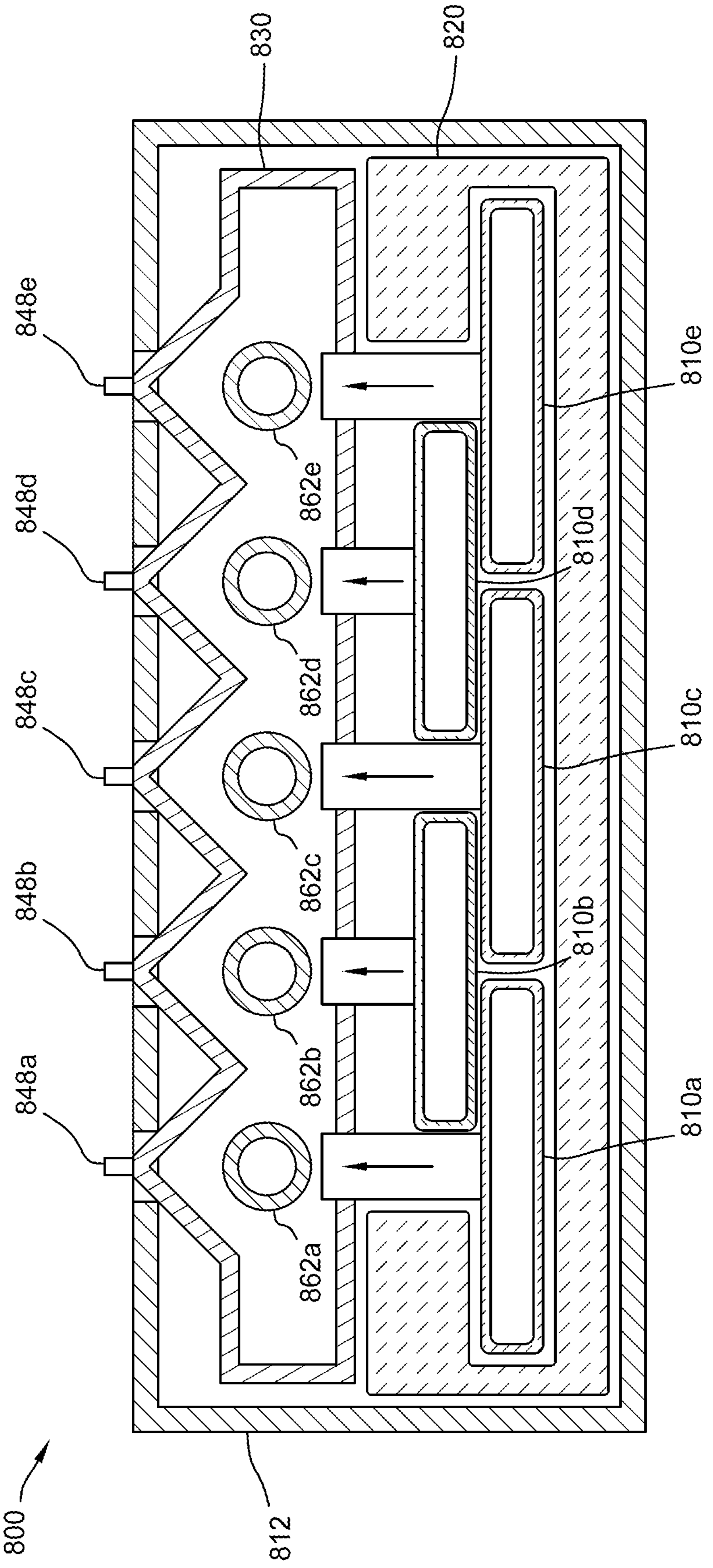
FIG. 8 illustrates a schematic cross-sectional view of another evaporation assembly according to one or more implementations of the present disclosure.

FIG. 8 illustrates a schematic cross-sectional view of another evaporation assembly 800 according to one or more implementations of the present disclosure. The evaporation assembly 800 can be used in place of the thermal evaporation assembly 140 depicted in FIG. 1. The evaporation assembly 800 includes a plurality of modular evaporators 810*a*-810*e* (collectively 810) positioned in an evaporator body 812. The evaporator body 812 can be the evaporator body 230. The evaporation assembly 800 further includes a heater 820. The heater 820 is positioned in the evaporator body 812 to supply heat to the modular evaporators 810. Any suitable heater that supplies sufficient heat to the modular evaporators 810 to vaporize the material to be evaporated can be used. The evaporation assembly 800 further includes a baffle plate 830. The baffle plate 830 can be the baffle plate 260. The baffle plate 830 includes a plurality of through-holes 862*a*-862*e* (collectively 862). Each through-hole 862*a*-862*e* is associated with a corresponding linear array of nozzles 848*a*-848*e*. For example, the through-hole 862*a* controls the flow of evaporated material to the linear array of nozzles 848*a*. In one implementation which can be combined with other implementations, the baffle plate 830 includes a plurality of through-holes 862*a*-862*e* formed below each linear array of nozzles 848*a*-848*e*. Each modular evaporator 810*a*-810*e* is associated with a corresponding linear array of nozzles 848*a*-848*e*. For example, the modular evaporator 810*a* supplies evaporated material to the linear array of nozzles 848.

EXAMPLES

The following non-limiting examples are provided to further illustrate implementations described herein. However, the examples are not intended to be all inclusive and are not intended to limit the scope of the implementations described herein.

Comparative Example 1

The comparative example calculates the area ratio (AR) for the current circular crucible design.

$AR=((\pi r^2)/(n*\pi r^2))$

Crucible Area=3.142×(21.5)^2=1452.38 mm$^2$

Nozzles Area(120 nozzles)=120×3.142×(1.2)^2=456.21 mm$^2$

AR(circular crucible)=1452.38/456.21=3.18

Comparative Example 2

$AR=((\pi r^2)/(n*\pi r^2))$

Crucible Area=3.142×(21.5)^2=1452.38 mm$^2$

Nozzles Area(50 nozzles)=50×3.142×(2.5)^2=981.87 mm$^2$

AR(circular crucible)=1452.38/981.87=1.48

Example 1

$AR=((w*l)/(n*\pi r^2))$

Crucible Area($w*l$)=420 mm×240 mm=100,800 mm$^2$

Nozzles Area(50 nozzles)=50×3.142×(2.5)^2=981.87 mm$^2$

AR(Flat crucible)=100800/981.87=102.66

Example 2

$AR=((w*l)/(n*\pi r^2))$

Crucible Area($w*l$)=420 mm×240 mm=100,800 mm$^2$

Nozzles Area(120 nozzles)=120×3.142×(1.2)^2=456.21 mm$^2$

AR(Flat crucible)=100800/456.21=220.95

Implementations can include one or more of the following potential advantages. The thermal evaporator design with a flat crucible increases the surface area to vaporize the alkali metal and metal alloys, which allows significant higher vapor pressure with lower evaporation temperature. This higher vapor pressure allows for higher deposition rates. The thermal evaporator design described herein is capable of using alkali metals and metal alloys at very high uniform evaporation rates at relatively low temperatures. The thermal evaporator design described herein enables roll-to-roll processes to be run with thin metal substrates at substantially lower tension and higher web speed. This lower tension helps reduce wrinkling of thin metal substrates as it helps retain the tensile strength of the thin metal substrate. Due to the lower thermal budget of evaporation, substrate cooling requirements are minimized. The lower thermal budget of evaporation also enables ramp up and ramp down of evaporators quickly, which increases the production tool yield.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Embodiments Listing

The present disclosure provides, among others, the following embodiments, each of which can be considered as optionally including any alternate embodiments:

Clause 1. An evaporation assembly, comprising:

a flat crucible for holding a material to be evaporated, the flat crucible comprising a rectangular body defining an interior region for holding the material to be evaporated, the rectangular body having an opening through which the evaporated material can escape, the rectangular body having a length dimension and a width dimension defining an evaporation surface area; and an evaporator body fluidly coupled with the rectangular body, the evaporator body comprising a top surface having a plurality of linear arrays of nozzles each nozzle having an opening defined by a diameter, wherein a total area of the openings defines a nozzle opening surface area and the evaporation surface area is greater than the nozzle opening surface area.

Clause 2. The evaporation assembly of Clause 1, wherein an area ratio of the evaporation surface area to the nozzle opening surface area is from about 100 to about 330.

Clause 3. The evaporation assembly of Clause 1 or Clause 2, wherein the top surface of the evaporator body is a planar surface.

Clause 4. The evaporation assembly of any one of Clauses 1-3, wherein the top surface of the evaporator body has a zig-zag pattern defining longitudinal grooves.

Clause 5. The evaporation assembly of Clause 4, wherein opposing sidewalls of the evaporator body have a zig-zag pattern defining longitudinal grooves.

Clause 6. The evaporation assembly of any one of Clauses 1-5, wherein the evaporator body comprises: a baffle region having a plurality of baffle plates, each baffle plate extending from a first sidewall of the evaporator body to a second sidewall of the evaporator body, wherein the first sidewall is opposite the second sidewall.

Clause 7. The evaporation assembly of Clause 6, wherein the evaporator body further comprises: a heater region positioned below the baffle region, the heater region comprising a plurality of tubular heaters, the evaporator body having a bottom surface that defines an opening which corresponds with the opening in the rectangular body.

Clause 8. The evaporation assembly of Clause 7, further comprising a plurality of baffles dividing the rectangular body into separate compartments.

Clause 9. The evaporation assembly of Clause 8, wherein each baffle extends from a bottom surface of the rectangular body through the opening into the heater region between adjacent tubular heaters.

Clause 10. The evaporation assembly of Clause 8 or Clause 9, wherein each compartment of the separate compartments corresponds to a linear array of nozzles of the plurality of linear arrays of nozzles.

Clause 11. The evaporation assembly of any one of Clauses 1-10, further comprising a heat source in thermal contact with the evaporator body.

Clause 12. An evaporation assembly, comprising:

a flat crucible for holding a material to be evaporated, the flat crucible comprising:

- a rectangular body having a length and width dimension, the rectangular body comprising:
  - a top surface having an opening through which evaporated material can escape, the rectangular body having a length dimension and a width dimension defining an evaporation surface area;
  - a bottom surface opposite the top surface;
  - a first pair of opposing sidewalls extending upward from and perpendicular to the bottom surface;
  - a second pair of opposing sidewalls extending upward from and perpendicular to the bottom surface, the bottom surface, the first pair of opposing sidewalls, and the second pair of opposing sidewalls defining an interior region for holding the material to be evaporated; and an evaporator body fluidly coupled with the rectangular body and having a length and width dimension, the evaporator body comprising:

a heater region having a plurality of heating rods positioned therein; and a baffle region positioned above the heater region, the baffle region comprising:

a plurality of linear arrays of nozzles for delivering the evaporated material, each nozzle having an opening defined by a diameter, wherein a total area of the openings defines a nozzle opening surface area and the evaporation surface area is greater than the nozzle opening surface area.

Clause 13. The evaporation assembly of Clause 12, wherein an area ratio of the evaporation surface area to the nozzle opening surface area is from about 100 to about 330.

Clause 14. The evaporation assembly of Clause 12 or Clause 13, wherein an area ratio of the evaporation surface area to the nozzle opening surface area is greater than about 50:1.

Clause 15. The evaporation assembly of any one of Clauses 12-14, wherein the top surface of the evaporator body is a planar surface.

Clause 16. The evaporation assembly of any one of Clauses 12-15, wherein the top surface of the evaporator body has a zig-zag pattern defining longitudinal grooves.

Clause 17. The evaporation assembly of Clause 16, wherein opposing sidewalls of the evaporator body have a zig-zag pattern defining longitudinal grooves.

Clause 18. The evaporation assembly of any one of Clauses 12-17, further comprising a plurality of baffles extending along the length dimension of the rectangular body and dividing the rectangular body into separate compartments.

Clause 19. The evaporation assembly of Clause 18, wherein each baffle extends from a bottom surface of the rectangular body through the opening into the heater region between adjacent tubular heaters.

Clause 20. The evaporation assembly of Clause 18 or Clause 19, wherein each compartment of the separate compartments corresponds to a linear array of nozzles of the plurality of linear arrays of nozzles.

Clause 21. The evaporation assembly of any one of Clauses 12-20, further comprising a heat source in thermal contact with the evaporator body.

Clause 22. The evaporation assembly of any one of Clauses 12-21, wherein each baffle plate has a plurality of through-holes.

Clause 23. The evaporation assembly of any one of Clauses 12-22, further comprising a heat source in thermal contact with the rectangular body.

Clause 24. A thermal evaporator, comprising:

an evaporator body having a length and width dimension, the evaporator body comprising:

a heater region having a plurality of heating rods positioned therein;

a baffle region positioned above the heater region, the baffle region comprising a plurality of linear arrays of nozzles for delivering evaporated material, each nozzle having an opening defined by a diameter; and a crucible region positioned below the heater region, the crucible region designed to hold the material to be evaporated, wherein the length dimension and the width dimension define an evaporation surface area and a total area of the openings defines a nozzle opening surface area and the evaporation surface area is greater than the nozzle opening surface area.

Clause 25. The thermal evaporator of Clause 24, wherein an area ratio of the evaporation surface area to the nozzle opening surface area is from about 100 to about 330.

Clause 26. The thermal evaporator of Clause 24 or Clause 25, wherein an area ratio of the evaporation surface area to the nozzle opening surface area is greater than about 50:1.

Clause 27. The thermal evaporator of any one of Clauses 24-26, wherein a top surface of the evaporator body is a planar surface.

Clause 28. The thermal evaporator of any one of Clauses 24-27, wherein a top surface of the evaporator body has a zig-zag pattern defining longitudinal grooves.

Clause 29. The thermal evaporator of Clause 28, wherein opposing sidewalls of the evaporator body have a zig-zag pattern defining longitudinal grooves.

Clause 30. The thermal evaporator of any one of Clauses 24-29, further comprising a plurality of baffles extending along the length dimension of the evaporator body and dividing the evaporator body into separate compartments.

Clause 31. The thermal evaporator of Clause 30, wherein each baffle extends from a bottom surface of the evaporator body through the opening into the heater region between adjacent tubular heaters.

Clause 32. The thermal evaporator of Clause 30 or Clause 31, wherein each compartment of the separate compartments corresponds to a linear array of nozzles of the plurality of linear arrays of nozzles.

Clause 33. The thermal evaporator of any one of Clauses 24-32, further comprising a heat source in thermal contact with the evaporator body.

Clause 34. The thermal evaporator of any one of Clauses 24-33, wherein each baffle plate has a plurality of through-holes.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

What is claimed is:

1. An evaporation assembly, comprising:

a flat bottom crucible for holding a material to be evaporated, the flat bottom crucible comprising a rectangular body defining an interior region for holding the material to be evaporated, the rectangular body having an opening through which the evaporated material can escape, the opening opposite a bottom surface, the rectangular body having a length dimension and a width dimension defining an evaporation surface area and a plurality of baffles dividing the rectangular body into compartments, each baffle of the plurality of baffles extending from the bottom surface through the opening, wherein a baffle of the plurality of baffles comprises a baffle plate having a through-hole configured to allow the material to be evaporated to travel between at least two compartments of the compartments; and an evaporator body fluidly coupled with the rectangular body, the evaporator body comprising a top surface having a plurality of linear arrays of nozzles each nozzle having an opening defined by a diameter, wherein a total area of the openings defines a nozzle opening surface area and the evaporation surface area is greater than the nozzle opening surface area.

2. The evaporation assembly of claim 1, wherein an area ratio of the evaporation surface area to the nozzle opening surface area is from about 100 to about 330.

3. The evaporation assembly of claim 1, wherein the top surface of the evaporator body is a planar surface.

4. The evaporation assembly of claim 1, wherein the top surface of the evaporator body has a zig-zag pattern defining longitudinal grooves.

5. The evaporation assembly of claim 4, wherein opposing sidewalls of the evaporator body have a zig-zag pattern defining longitudinal grooves.

6. The evaporation assembly of claim 1, wherein the baffle plate extend s from a first sidewall of the evaporator body to a second sidewall of the evaporator body, wherein the first sidewall is opposite the second sidewall.

7. The evaporation assembly of claim 6, wherein the evaporator body further comprises a heater region positioned below the baffle region, the heater region comprising a plurality of tubular heaters, the evaporator body having a bottom surface that defines an opening which corresponds with the opening in the rectangular body.

8. The evaporation assembly of claim 7, wherein each baffle extends into the heater region between adjacent tubular heaters.

9. The evaporation assembly of claim 7, wherein each compartment of the compartments corresponds to a linear array of nozzles of the plurality of linear arrays of nozzles.

10. The evaporation assembly of claim 1, further comprising a heat source in thermal contact with the evaporator body.

11. An evaporation assembly, comprising:

a flat bottom crucible for holding a material to be evaporated, the flat bottom crucible comprising:

a rectangular body having a length and width dimension, the rectangular body comprising:

a top surface having an opening through which evaporated material can escape, the rectangular body having a length dimension and a width dimension defining an evaporation surface area;

a bottom surface opposite the top surface;

a first pair of opposing sidewalls extending upward from and perpendicular to the bottom surface;

a second pair of opposing sidewalls extending upward from and perpendicular to the bottom surface, the bottom surface, the first pair of opposing sidewalls, and the second pair of opposing sidewalls defining an interior region for holding the material to be evaporated;

a plurality of baffles dividing the rectangular body into compartments, each baffle of the plurality of baffles comprising a baffle plate having a through-hole configured to allow the material to be evaporated to travel between at least two compartments of compartments of the rectangular body, the baffles extending from the bottom surface through the opening; and an evaporator body fluidly coupled with the rectangular body and having a length and width dimension, the evaporator body comprising:

a heater region having a plurality of heating rods positioned therein; and a baffle region positioned above the heater region, the baffle region comprising:

a plurality of linear arrays of nozzles for delivering the evaporated material, each nozzle having an opening defined by a diameter, wherein a total area of the openings defines a nozzle opening surface area and the evaporation surface area is greater than the nozzle opening surface area.

12. The evaporation assembly of claim 11, wherein an area ratio of the evaporation surface area to the nozzle opening surface area is from about 100 to about 330.

13. The evaporation assembly of claim 11, wherein:

the top surface of the evaporator body is a planar surface;

the top surface of the evaporator body has a zig-zag pattern defining longitudinal grooves; or a combination thereof.

14. The evaporation assembly of claim 11, wherein the plurality of baffles extend along the length dimension of the rectangular body.

15. A thermal evaporator, comprising:

an evaporator body having a length and width dimension, the evaporator body comprising:

a heater region having a plurality of heating rods positioned therein;

a baffle region positioned above the heater region, the baffle region comprising:

a plurality of linear arrays of nozzles for delivering evaporated material, each nozzle having an opening defined by a diameter; and a crucible region positioned below the heater region, the crucible region designed to hold the material to be evaporated, wherein the length dimension and the width dimension define an evaporation surface area and a total area of the openings defines a nozzle opening surface area and the evaporation surface area is greater than the nozzle opening surface area, the crucible region comprising a plurality of baffles extend along the length dimension of the evaporation surface area and dividing the crucible region into compartments, wherein a baffle of the plurality of baffles comprises a baffle plate having a through-hole configured to allow the material to be evaporated to travel between at least two compartments of the compartments.

16. The thermal evaporator of claim 15, wherein an area ratio of the evaporation surface area to the nozzle opening surface area is from about 100 to about 330.

17. The thermal evaporator of claim 15, wherein a top surface of the evaporator body is a planar surface.

18. The thermal evaporator of claim 15, wherein a top surface of the evaporator body has a zig-zag pattern defining longitudinal grooves.

19. The thermal evaporator of claim 18, wherein opposing sidewalls of the evaporator body have a zig-zag pattern defining longitudinal grooves.

* * * * *